(12) United States Patent
Wakita et al.

(10) Patent No.: US 9,828,469 B2
(45) Date of Patent: Nov. 28, 2017

(54) POLYIMIDE PRECURSOR, POLYIMIDE RESIN FILM PRODUCED FROM SAID POLYIMIDE PRECURSOR, DISPLAY ELEMENT, OPTICAL ELEMENT, LIGHT-RECEIVING ELEMENT, TOUCH PANEL AND CIRCUIT BOARD EACH EQUIPPED WITH SAID POLYIMIDE RESIN FILM, ORGANIC EL DISPLAY, AND METHODS RESPECTIVELY FOR PRODUCING ORGANIC EL ELEMENT AND COLOR FILTER

(71) Applicant: TORAY INDUSTRIES, INC., Tokyo (JP)

(72) Inventors: Junji Wakita, Otsu (JP); Yukari Arimoto, Otsu (JP); Masao Tomikawa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 107 days.

(21) Appl. No.: 15/021,144

(22) PCT Filed: Sep. 18, 2014

(86) PCT No.: PCT/JP2014/074717
§ 371 (c)(1),
(2) Date: Mar. 10, 2016

(87) PCT Pub. No.: WO2015/046019
PCT Pub. Date: Apr. 2, 2015

(65) Prior Publication Data
US 2016/0222165 A1    Aug. 4, 2016

(30) Foreign Application Priority Data
Sep. 27, 2013  (JP) .................... 2013-201182

(51) Int. Cl.
| | | |
|---|---|---|
| *C08G 73/10* | (2006.01) | |
| *G02B 5/20* | (2006.01) | |
| *H01L 51/52* | (2006.01) | |
| *C09D 179/08* | (2006.01) | |
| *C08G 73/16* | (2006.01) | |
| *G02B 5/22* | (2006.01) | |
| *G03F 7/00* | (2006.01) | |
| *H01L 27/32* | (2006.01) | |
| *H01L 51/56* | (2006.01) | |
| *H01L 51/00* | (2006.01) | |

(52) U.S. Cl.
CPC ..... *C08G 73/1082* (2013.01); *C08G 73/1042* (2013.01); *C08G 73/1046* (2013.01); *C08G 73/1075* (2013.01); *C08G 73/16* (2013.01); *C09D 179/08* (2013.01); *G02B 5/20* (2013.01); *G02B 5/223* (2013.01); *G03F 7/0007* (2013.01); *H01L 27/322* (2013.01); *H01L 51/0035* (2013.01); *H01L 51/5253* (2013.01); *H01L 51/56* (2013.01); *H01L 51/0097* (2013.01)

(58) Field of Classification Search
CPC ........... G08G 73/1082; G08G 73/1042; G08G 73/1046; G08G 73/16; C09D 179/08; G03F 7/0007; G02B 5/20; G02B 5/223; H01L 51/035; H01L 51/5253; H01L 51/56; H01L 51/0097
USPC .............................................. 430/7; 313/504
See application file for complete search history.

(56) References Cited

U.S. PATENT DOCUMENTS

| | | | |
|---|---|---|---|
| 2012/0021234 A1 | 1/2012 | Fukukawa | |
| 2013/0178597 A1 | 7/2013 | Takasawa | |
| 2015/0183931 A1 | 7/2015 | Fujii | |
| 2015/0183932 A1* | 7/2015 | Katayama | C08J 5/18 257/40 |

FOREIGN PATENT DOCUMENTS

| | | |
|---|---|---|
| JP | 0539363 | 2/1993 |
| JP | 11080350 | 3/1999 |
| JP | 2007284414 | 11/2007 |
| JP | 2012041530 | 3/2012 |
| JP | 2013023597 | 2/2013 |

(Continued)

OTHER PUBLICATIONS

International Search Report for International Application No. PCT/JP2014/074717 dated Dec. 22, 2014.

(Continued)

*Primary Examiner* — John A McPherson
(74) *Attorney, Agent, or Firm* — RatnerPrestia

(57) ABSTRACT

The present invention provides a polyimide precursor that serves to produce a cured film that has high light permeability in combination with low birefringence and low linear thermal expansion. The polyimide precursor includes at least an acid dianhydride residue as represented by Formula (1), a diamine residue as represented by Formula (2), and one or more diamine residues as represented by Formula (3), the acid dianhydride residue as represented by Formula (1) accounting for 50 mol % or more of the total quantity of acid dianhydride residues in the polyimide precursor, the diamine residue as represented by Formula (2) accounting for 50 mol % or more of the total quantity of diamine residues in the polyimide precursor, and the diamine residue as represented by Formula (3) accounting for 15 mol % or less of the total quantity of diamine residues in the polyimide precursor.

20 Claims, 6 Drawing Sheets

(56) References Cited

FOREIGN PATENT DOCUMENTS

WO      2010113412      10/2010
WO      2014007112      1/2014

OTHER PUBLICATIONS

Pianca, M., et al., "Composition and sequence distribution of vinylidene fluoride copolymer and terpolymer fluoroelastomers. Determination by 19F nuclear magnetic resonance spectroscopy and correlation with some properties," Feb. 1987, pp. 224-230, vol. 28(2), Polymer (abstract only).

Written Opinion of the International Searching Authority for International Application No. PCT/JP2014/074717 dated Dec. 22, 2014.

* cited by examiner

POLYIMIDE PRECURSOR, POLYIMIDE RESIN FILM PRODUCED FROM SAID POLYIMIDE PRECURSOR, DISPLAY ELEMENT, OPTICAL ELEMENT, LIGHT-RECEIVING ELEMENT, TOUCH PANEL AND CIRCUIT BOARD EACH EQUIPPED WITH SAID POLYIMIDE RESIN FILM, ORGANIC EL DISPLAY, AND METHODS RESPECTIVELY FOR PRODUCING ORGANIC EL ELEMENT AND COLOR FILTER

CROSS-REFERENCE TO RELATED APPLICATIONS

This is the U.S. National Phase application of PCT International Application No. PCT/JP2014/074717, filed Sep. 18, 2014, and claims priority to Japanese Patent Application No. 2013-201182, filed Sep. 27, 2013, the disclosures of each of these applications being incorporated herein by reference in their entireties for all purposes.

FIELD OF THE INVENTION

The present invention relates to a polyimide precursor, polyimide resin film produced therefrom, display element, optical element, light-receiving element, touch screen, circuit board, and organic EL display containing it, and methods for producing organic EL emission elements and color filters.

BACKGROUND OF THE INVENTION

Organic film is high in flexibility as compared with glass, difficult to break, and lightweight. Recently, study has been performed with the aim of developing a flexible display using organic film as the substrate of a flat panel display.

Generally, resins used in organic film include polyester, polyamide, polyimide, polycarbonate, polyether sulfone, acrylic, and epoxy. Of these, polyimide resin is high in heat resistance, mechanical strength, abrasion resistance, dimensional stability, chemical resistance, and insulation capability, and accordingly in wide use in the electric/electronic industries.

For use as an alternative to the glass substrate in display elements, polyimide resin is required to have high transparency and low birefringence. These properties are necessary to obtain clear images.

To produce polyimide that is high in transparency and low in birefringence, a useful method is to use an alicyclic monomer as at least either of the two components: acid dianhydride and diamine (e.g. see patent document 1).

On the other hand, if a support substrate is coated with a polyimide precursor resin composition in the manufacturing process, followed by, in particular, heating it to cure the polyimide precursor to form polyimide resin film, there may occur problems including warp of the support substrate due to thermal stress and peeling of the polyimide resin film from the support substrate To avoid them, the polyimide is required have a coefficient of thermal expansion that is close to that of the support substrate.

Most polyimide products, however, have a high coefficient of linear thermal expansion (CTE) in the range from 50 to 100 ppm/K. In recent years, low-CTE polyimide materials have been proposed. These studies have reported that as essential requirements, the polyimide should have a straight, rigid backbone chain structure and the internal rotation should be in a restricted state (e.g. see non-patent document 1). Specifically, it is reported that wholly aromatic polyimide derived from an aromatic dianhydride and an aromatic diamine can work effectively. However, wholly aromatic polyimide gives an absorption band attributed to intramolecular or intermolecular charge transfer, which appears in the visible light wavelength range, resulting in polyimide resin film colored in yellow or brown.

As a solution to this problem, a polyimide produced from material having an alicyclic structure that can achieve transparency has been disclosed. It has been disclosed, for example, that polyimides produced from a combination of a trans-1,4-diaminocyclohexane, which is an alicyclic diamine of a rigid structure, and a rigid aromatic dianhydride have transparency and low CTE (e.g. see patent document 3). It has also been disclosed that polyester imides produced from an alicyclic dianhydride containing an ester group have high transparency and low birefringence (e.g. see patent document 2). It has been disclosed, furthermore, that copolymerized polyimides produced from 3,3',4,4'-biphenyl tetracarboxylic dianhydride, fluorene-containing aromatic dianhydride, and trans-1,4-diaminocyclohexane shows high transparency, low birefringence, and low CTE (e.g. see patent document 4).

PRIOR ART DOCUMENTS

Patent Documents

Patent document 1: Japanese Unexamined Patent Publication (Kokai) No. HEI 11-080350
Patent document 2: Japanese Unexamined Patent Publication (Kokai) No. 2012-041530
Patent document 3: Japanese Unexamined Patent Publication (Kokai) No. 2007-284414
Patent document 4: International Publication WO 2014/007112

Non-Patent Documents

Non-patent document 1: Polymer, 28, 228 (1987)

SUMMARY OF THE INVENTION

Problems to be Solved by the Invention

However, the invention in patent document 2 fails to develop a polymer with low birefringence because a monomer of a rigid structure is used. Furthermore, patent document 3 describes that low CTE is desired in addition to high transparency and low birefringence, but polyimides with low birefringence have high CTE in the range of 70 to 100 ppm/K, failing to achieve low birefringence and low CTE simultaneously. Patent document 4 insists that materials produced had high transparency, low birefringence, and low CTE, but polyimides with a low CTE of 30 ppm/K had a high birefringence of 0.07 or more, indicating that low birefringence and low CTE were not achieved simultaneously. Thus, highly transparent polyimide having low birefringence and low CTE in good balance has not been successfully developed yet.

In view of the above problems, an object of the present invention is to provide a polyimide precursor that serves to produce cured polyimide resin film that has high light permeability in combination with low birefringence and low linear thermal expansion.

Means of Solving the Problems

Specifically, the present invention provides a polyimide precursor comprising at least an acid dianhydride residue as represented by Formula (1), a diamine residue as represented by Formula (2), and one or more diamine residues as represented by Formula (3), the acid dianhydride residue as represented by Formula (1) accounting for 50 mol % or more of the total quantity of acid dianhydride residues in the polyimide precursor, the diamine residue as represented by Formula (2) accounting for 50 mol % or more of the total quantity of diamine residues in the polyimide precursor, and the diamine residue as represented by Formula (3) accounting for 15 mol % or less of the total quantity of diamine residues in the polyimide precursor.

[Chemical compound 1]

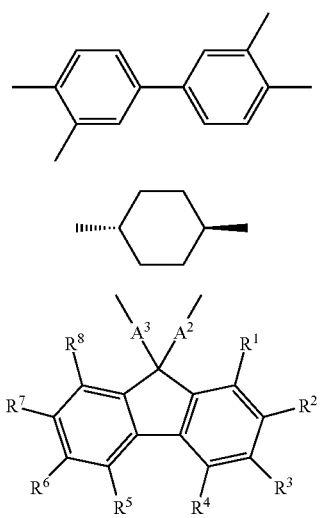

In Formula (3), $R^1$ to $R^8$ are independently one selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, and silyl group, which may further contain a substituent group and which may contain a condensed ring structure formed of adjacent groups connected to each other.

In Formula (3), $A^1$ and $A^2$, which may be identical to or different from each other, each represent a structure formed of an aromatic ring, aliphatic ring, chain hydrocarbon group, a combination of a plurality thereof, or a combination thereof with one selected from the group consisting of amide group, ester group, ether group, alkylene group, oxyalkylene group, vinylene group, and haloalkylene group.

Advantageous Effect of the Invention

According to the present invention, it is possible to obtain a polyimide precursor that forms, when cured, a polyimide resin film that has high transparency, low birefringence, and low CTE in the visible light wavelength range.

DESCRIPTION OF PREFERRED EMBODIMENTS

Figure 1A:
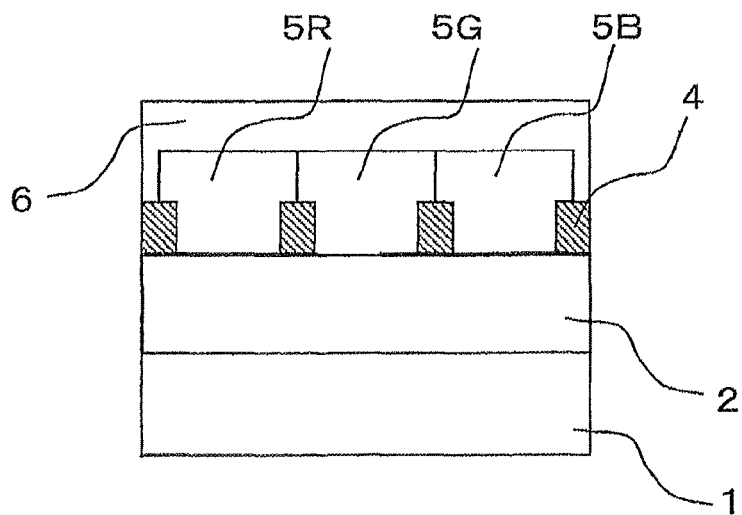
FIG. 1A A cross-sectional view showing a typical color filter.
Figure 1B:
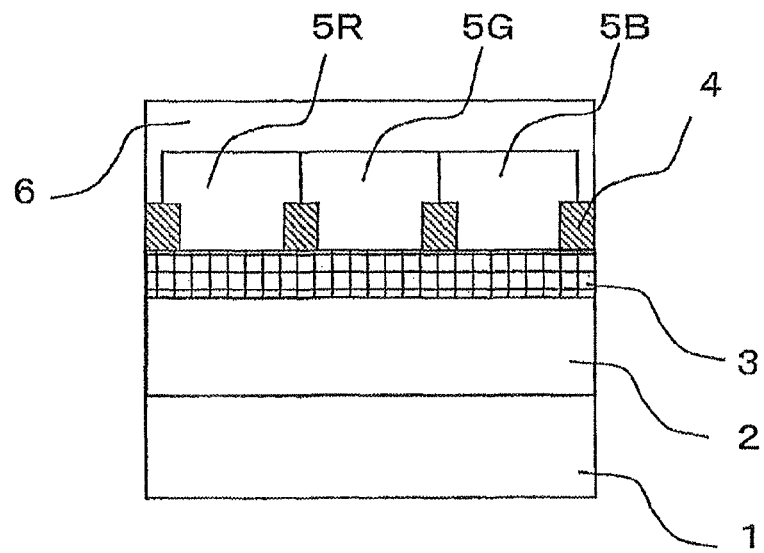
FIG. 1B A cross-sectional view showing a typical color filter.
Figure 1C:
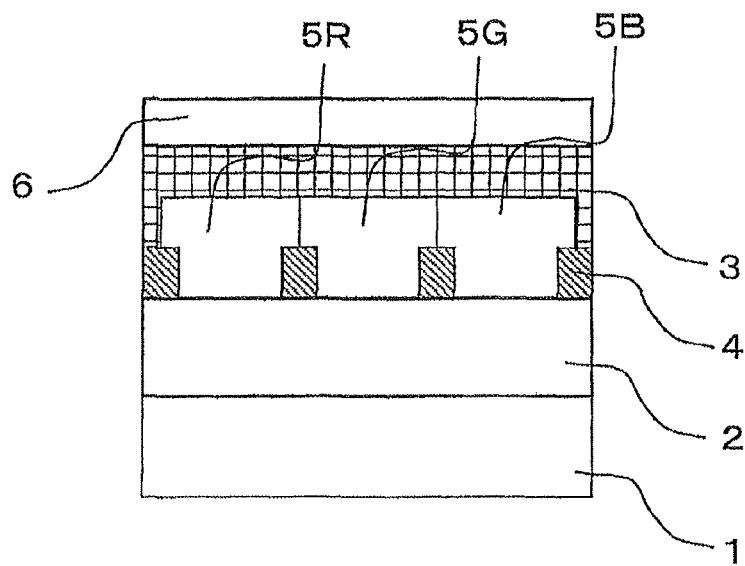
FIG. 1C A cross-sectional view showing a typical color filter.
Figure 1D:
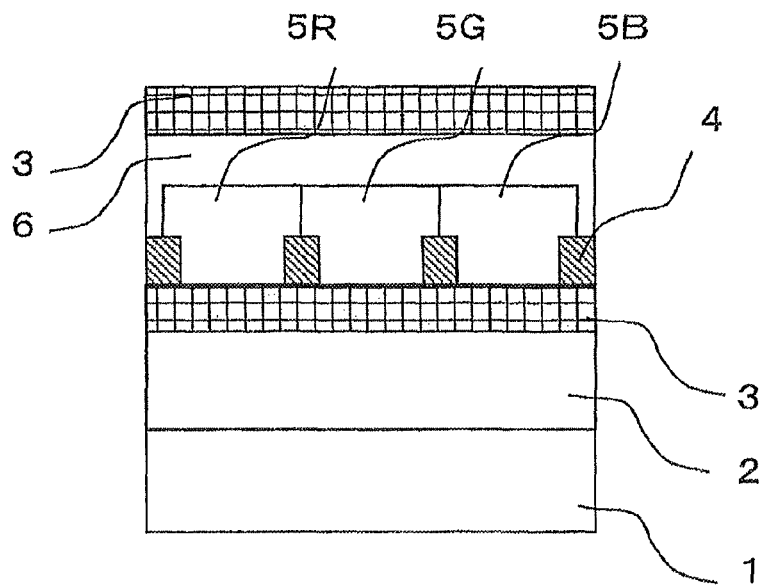
FIG. 1D A cross-sectional view showing a typical color filter.

Embodiments of the present invention are described in detail below. It should be understood, however, that the invention is not construed as being limited to these embodiments.

<Polyimide Precursor>

Specifically, the present invention provides a polyimide precursor comprising an acid dianhydride residue as represented by Formula (1), a diamine residue as represented by Formula (2), and one or more diamine residues as represented by Formula (3), the acid dianhydride residue as represented by Formula (1) accounting for 50 mol % or more of the total quantity of acid dianhydride residues in the polyimide precursor, the diamine residue as represented by Formula (2) accounting for 50 mol % or more of the total quantity of diamine residues in the polyimide precursor, and the diamine residue as represented by Formula (3) accounting for 15 mol % or less of the total quantity of diamine residues in the polyimide precursor.

[Chemical compound 2]

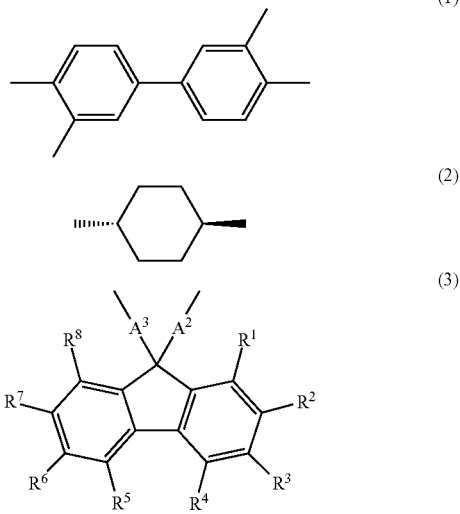

In Formula (3), $R^1$ to $R^8$ are independently one selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, and silyl group, which may further contain a substituent group and which may contain a condensed ring structure formed of adjacent groups connected to each other.

In Formula (3), $A^1$ and $A^2$, which may be identical to or different from each other, each represent a structure formed of an aromatic ring, aliphatic ring, chain hydrocarbon group, a combination of a plurality thereof, or a combination thereof with one selected from the group consisting of amide group, ester group, ether group, alkylene group, oxyalkylene group, vinylene group, and haloalkylene group.

Of these groups, an alkyl group is a saturated aliphatic hydrocarbon group such as, for example, methyl group, ethyl group, n-propyl group, isopropyl group, n-butyl group, sec-butyl group, and tert-butyl group, which may or may not contain a substituent group. For substitution, there are no specific limitations on the substituent groups to be added and available substituent groups include, for example, alkyl group, aryl group and heteroaryl group, and this is common to the other descriptions given below.

A cycloalkyl group is a saturated alicyclic hydrocarbon group such as, for example, cyclopropyl group, cyclobutyl group, cyclopentyl group, cyclohexyl group, norbornyl group, and adamanthyl group, which may or may not contain a substituent group.

A heterocyclic group is an aliphatic ring having a non-carbon atom in the ring such as, for example, pyran ring, piperidine ring, and cyclic amide, which may or may not contain a substituent group. There are no specific limitations on the number of carbon atoms in a heterocyclic group, but commonly it is in the range of 2 or more and 20 or less.

An alkenyl group is an unsaturated aliphatic hydrocarbon group containing a double bond such as, for example, vinyl group, allyl group, and butadienyl group, which may or may not contain a substituent group.

A cycloalkenyl group is an unsaturated alicyclic hydrocarbon group containing a double bond such as, for example, cyclopentenyl group, cyclopentadienyl group, and cyclohexenyl group, which may or may not contain a substituent group.

An alkoxy group is a functional group in which an aliphatic hydrocarbon group is bonded through an ether bond such as, for example, methoxy group, ethoxy group, and propoxy group, and the aliphatic hydrocarbon group may or may not contain a substituent group.

An aryl ether group is a functional group in which an aromatic hydrocarbon group is bonded through an ether bond such as, for example, phenoxy group, and the aromatic hydrocarbon group may or may not contain a substituent group.

An aryl group is an aromatic hydrocarbon group such as, for example, phenyl group, naphthyl group, biphenyl group, fluorenyl group, phenanthryl group, terphenyl group, anthracenyl group and pyrenyl group, or a group containing a plurality thereof bonded to each other. They may or may not contain a substituent group Such substituent groups that may be contained in an aryl group include alkyl group, cycloalkyl group, alkenyl group, alkynyl group, alkoxy group, aryl ether group, alkylthio group, halogen, cyano group, amino group (the amino group may further contains an aryl or heteroaryl substituent group), silyl group, and boryl group.

A haloalkyl group is an alkyl group in which all or part of the hydrogen atoms are replaced with halogen atoms, such as, for example, trifluoromethyl group.

A silyl group is a group in which a reactive site of a silicon atom is replaced with an alkyl chain, such as trimethyl silyl group and triethyl silyl group, or with an alkoxy group.

For Formula (3) given above, for example, the wording "a condensed ring structure formed of adjacent groups connected to each other" refers to a conjugated or non-conjugated condensed ring formed of any pair of adjacent groups selected from $R^1$ to $R^8$ ($R^3$ and $R^4$, for example). Such a condensed ring may contain a nitrogen, oxygen, or sulfur atom within the ring structure or may be bonded to another ring.

For Formula (3), furthermore, an aromatic ring at $A^1$ and $A^2$ refers to a ring derived from an aromatic hydrocarbon, such as benzene, naphthalene, biphenyl, phenanthrene, anthracene, and pyrene.

An aliphatic ring is a ring derived from a saturated alicyclic hydrocarbon, such as cyclopropane, cyclohexane, norbornene, and adamantine.

A chain hydrocarbon group is a linear or branched hydrocarbon group that is not a cyclic hydrocarbon group.

An alkylene group is a divalent saturated aliphatic hydrocarbon group such as, for example, methylene group, ethylene group, n-propylene group, isopropylene group, n-butylene group, sec-butylene group, and tert-butylene group, which may or may not contain a substituent group.

An oxyalkylene group is a divalent functional group in which an aliphatic hydrocarbon group is bonded though an ether bond, such as, for example, oxyethylene group and oxypropylene group, and the aliphatic hydrocarbon group may or may not contain a substituent group.

A vinylene group is a divalent group having such a structure that is formed by removing two hydrogen atoms from ethylene.

A haloalkylene group is a divalent group having such a structure that is formed by removing a hydrogen atom from a haloalkyl group.

The dianhydride residue represented by Formula (1) accounts for 50 mol % or more, preferably 70 mol % or more, more preferably 80 mol % or more, of the total quantity of dianhydride residue in the polyimide precursor. With a rigid biphenyl structure accounting for more than a certain proportion, a polyimide produced from the polyimide precursor according to the present invention has low CTE and chemical resistance. The dianhydride residue represented by Formula (1) may account for, as the upper limit, 100 mol % of the total quantity of dianhydride residue in the polyimide precursor, but it preferably contains a dianhydride residue as represented by Formula (4) or Formulae from (25) to (28) as described later, and in such a case, the content is preferably 90 mol % or less.

The diamine residue represented by Formula (2) accounts for 50 mol % or more, preferably 70 mol % or more, more preferably 80 mol % or more, particularly preferably 90 mol % or more, of the total quantity of diamine residue in the polyimide precursor. Since it is necessary to contain a diamine residue as represented by Formula (3), the diamine residue represented by Formula (2) accounts for, as the upper limit, preferably 98 mol % or less, more preferably 95 mol % or less, of the total quantity of diamine residue in the polyimide precursor. Having an alicyclic structure, the diamine residue represented by Formula (2) serves to shorten the conjugated part of the molecular chain if it accounts for more than a certain proportion in the molecular chain. Accordingly, when imidized, the polyimide precursor gives polyimide with high transparency. Having a rigid structure, furthermore, the polyimide has low CTE.

The polyimide precursor according to the present invention further contains a diamine residue as represented by Formula (3). This residue has a structure that contains a fluorene structure. The fluorene structure is bonded to the polyimide precursor backbone chain at the 9,9 position and this reduces the polarizability in the perpendicular direction to the polymer backbone chain, resulting in a polyimide with low birefringence after imidization. Since the fluorene residue represented by Formula (3) has a rigid structure, the rigidity of the backbone chain originating from the biphenyl group represented by Formula (1) and the cyclohexyl group represented by Formula (2) does not suffer a significant decrease. As a result, the polyimide produced from the polyimide precursor according to the present invention has low CTE.

The diamine residue represented by Formula (3) accounts for 15 mol % or less of the total quantity of diamine residue. From the viewpoint of decreasing the polarizability in the perpendicular direction to the polymer backbone chain, the diamine residue represented by Formula (3) accounts for, as the lower limit, preferably 1 mol % or more, more preferably 3 mol % or more, still more preferably 5 mol % or more. If the diamine residue represented by Formula (3) has a content in the above range, it ensures a more improved balance between low birefringence and low CTE. Unlike the cyclohexyl group represented by Formula (2), furthermore, the diamine residue represented by Formula (3) is an aromatic diamine residue and forms an electric charge transfer complex having an absorption band in the visible light wavelength range. However, if the diamine residue represented by Formula (3) has a content in the above range, the transmittance in the visible light wavelength range does not decrease significantly. As a result, the polyimide produced from the polyimide precursor according to the present invention has high transparency.

Another embodiment of the present invention is a polyimide precursor containing one or more dianhydride residues as represented by Formula (4).

[Chemical compound 3]

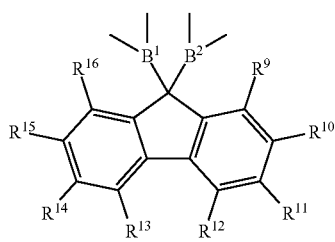

(4)

In Formula (4), $R^9$ to $R^{16}$ are independently one selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, and silyl group, which may further contain a substituent group and which may contain a condensed ring structure formed of adjacent groups connected to each other.

For Formula (4), the definitions of the alkyl groups, cycloalkyl group, heterocyclic group, alkenyl group, cycloalkenyl group, alkoxy group, aryl ether group, phenoxy group, aryl group, haloalkyl group, and silyl group in $R^9$ to $R^{16}$ and the wording "a condensed ring structure formed of adjacent groups connected to each other" are the same for those of $R^1$ to $R^8$ in Formula (3) given above (also the same for $R^{17}$ to $R^{157}$ mentioned later).

In Formula (4), $B^1$ and $B^2$, which may be identical to or different from each other, each represent a structure formed of an aromatic ring, aliphatic ring, chain hydrocarbon group, a combination of a plurality thereof, or a combination thereof with one selected from the group consisting of amide group, ester group, ether group, alkylene group, oxyalkylene group, vinylene group, and haloalkylene group.

The definitions of the aromatic ring, aliphatic ring, chain hydrocarbon group, alkylene group, oxy alkylene group, vinylene group, and haloalkylene group at $B^1$ and $B^2$ in Formula (4) are the same for those for $A^1$ and $A^2$ in Formula (3).

The dianhydride residue represented by Formula (4) has a structure containing a fluorene structure. As described above, the existence of a fluorene structure allows the polyimide formed by imidizing the polyimide precursor to have a decreased birefringence without suffering from a significant decrease in the rigidity of the backbone chain. Accordingly, introducing a fluorene structure into both the dianhydride residue and the diamine residue enables the formation of polyimide film with a further decreased birefringence. In addition, the structure in which the fluorene part is twisted with respect to the polymer backbone chain works to depress the formation of an electric charge transfer complex in the molecular chain. As a result, the polyimide produced from the polyimide precursor according to the present invention has high transparency.

The dianhydride residue represented by Formula (4) preferably accounts for 40 mol % or less of the total quantity of dianhydride residue in the polyimide precursor. A value in this range ensures a more improved balance between low birefringence and low CTE. This is preferable also for increasing the mechanical strength and reducing the crack generation during film formation. Furthermore, from the viewpoint of reducing the crack generation during film formation, the dianhydride residue represented by Formula (4) preferably accounts for 30 mol % or less, more preferably 25 mol % or less, of the total quantity of dianhydride residue. When a dianhydride residue as represented by Formula (4) is contained, the lower limit of its content is preferably 1 mol % or more, more preferably 5 mol % or more, still more preferably 10 mol % or more, of the total quantity of dianhydride residue.

When the polyimide precursor according to the present invention contains both a diamine residue as represented by Formula (3) and a dianhydride residue as represented by Formula (4), there are no specific limitations on the total content of the residues represented by Formula (3) or Formula (4) as long as the content of the residue represented by Formula (1), (2), (3), or (4) is in the content range specified for each of them However, from the viewpoint of reducing the crack generation during film formation, the total content of the residues represented by Formula (3) or Formula (4) is preferably 40 mol % or less, more preferably 30 mol % or less, still more preferably 15 mol % or less, of the total quantity of all residues.

It is preferable for $A^1$ and $A^2$ in Formula (3) to have a structure as represented by any of Formulae from (5) to (10) given below.

[Chemical compound 4]

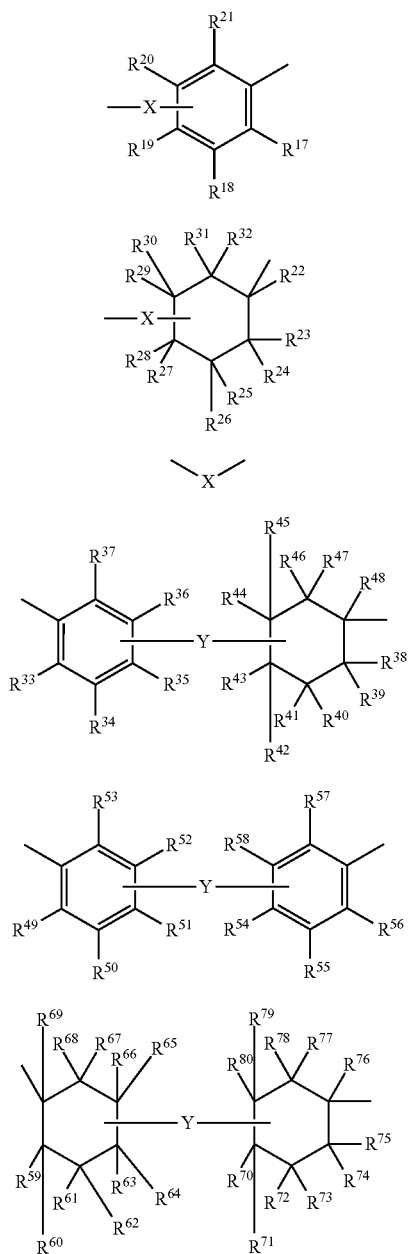

(5)
(6)
(7)
(8)
(9)
(10)

X in Formulae (5) to (7) is a single bond, ether group, alkylene group, oxyalkylene group, or vinylene group, and the other bond is connected to the fluorene ring. Here, the term "single bond" means that two components are connected directly through a single bond without an atom or a linking group interposed between them, and the definitions of the alkylene group etc. are the same for the X in $A^1$ and $A^2$ in Formula (3) given above.

Y in Formulae (8) to (10) are an amide group, ester group, ether group, alkylene group, oxyalkylene group, vinylene group, or haloalkylene group.

$R^{17}$ to $R^{80}$ in Formulae (5) to (10) are independently selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, hydroxyl group, and silyl group. In Formula (5), however, one of $R^{17}$ to $R^{21}$ is a linking group containing X. In Formula (6), one of $R^{22}$ to $R^{32}$ is a linking group containing X. In Formulae (8) to (10), either of the two ring structures may be connected to the fluorene ring. Furthermore, one of $R^{33}$ to $R^{37}$ and one of $R^{38}$ to $R^{48}$ each are a linking group containing Y. One of $R^{49}$ to $R^{53}$ and one of $R^{54}$ to $R^{58}$ each are a linking group containing Y. One of $R^{59}$ to $R^{69}$ and one of $R^{70}$ to $R^{80}$ each are a linking group containing Y.

It is preferable for $B^1$ and $B^2$ in Formula (4) to have a structure as represented by any of Formulae from (11) to (17) given below.

[Chemical compound 5]

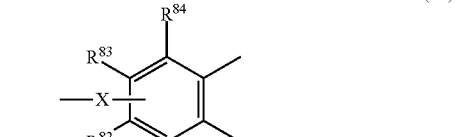

(11)

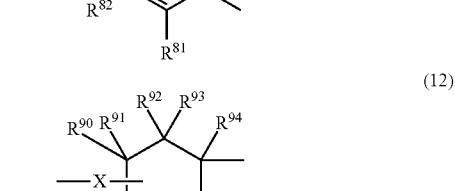

(12)

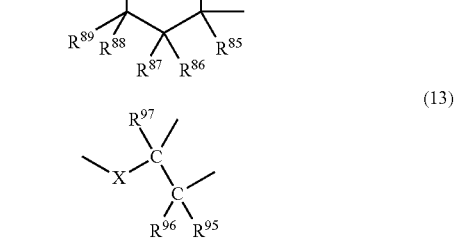

(13)

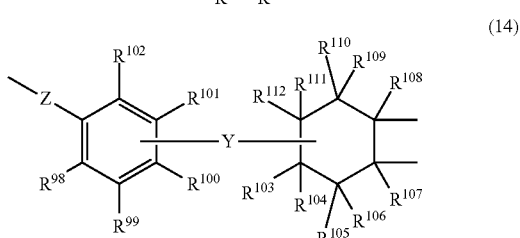

(14)

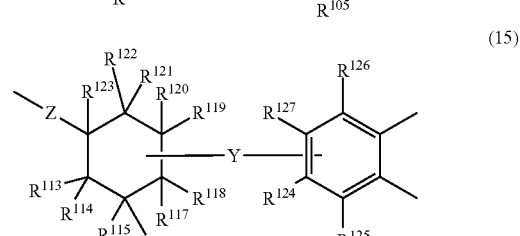

(15)

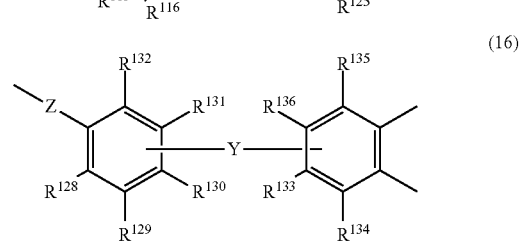

(16)

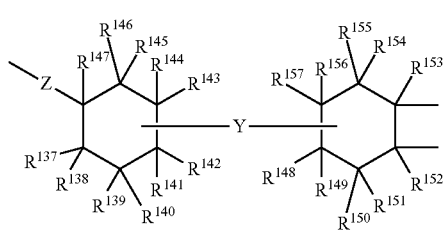
(17)

X in Formulae (11) to (13) is a single bond, ether group, alkylene group, oxyalkylene group, or vinylene group, and the other bond is connected to the fluorene ring.

Y in Formulae (14) to (17) are an amide group, ester group, ether group, alkylene group, oxyalkylene group, vinylene group, or haloalkylene group.

Z in Formulae (14) to (17) is a single bond and the other bond is connected to the fluorene ring.

$R^{81}$ to $R^{157}$ in Formulae (11) to (17) are independently selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, hydroxyl group, and silyl group. In Formula (11), however, one of $R^{81}$ to $R^{84}$ is a linking group containing X. In Formula (12), one of $R^{85}$ to $R^{94}$ is a linking group containing X. In Formula (14), one of $R^{98}$ to $R^{102}$ and one of $R^{103}$ to $R^{112}$ each are a linking group containing Y. In Formula (15), one of $R^{113}$ to $R^{123}$ and one of $R^{124}$ to $R^{127}$ each are a linking group containing Y. In Formula (16), one of $R^{128}$ to $R^{132}$ and one of $R^{133}$ to $R^{136}$ each are a linking group containing Y. In Formula (17), one of $R^{137}$ to $R^{147}$ and one of $R^{148}$ to $R^{157}$ each are a linking group containing Y.

Preferable examples of the diamine residues represented by Formula (3) include at least one divalent organic group selected from Formulae (18) to (21), though the present invention is not limited thereto.

[Chemical compound 6]

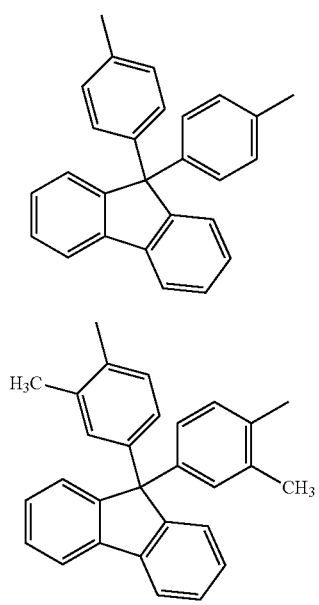

(18)

(19)

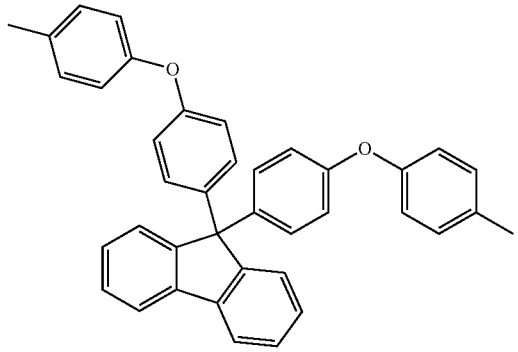

(20)

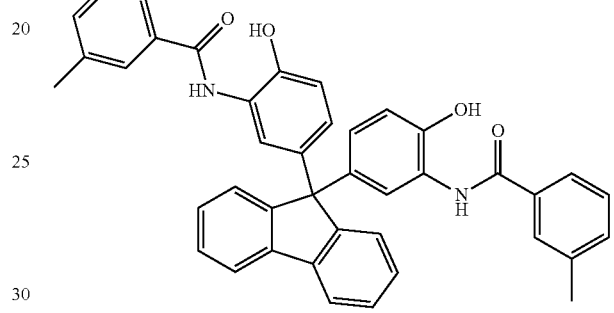

(21)

Preferable examples of the dianhydride residues represented by Formula (4) include at least one tetravalent organic group selected from Formulae (22) to (24), though the present invention is not limited thereto.

[Chemical compound 7]

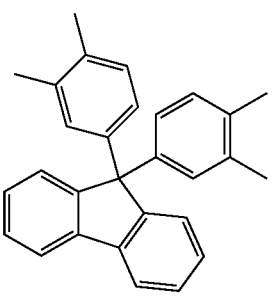

(22)

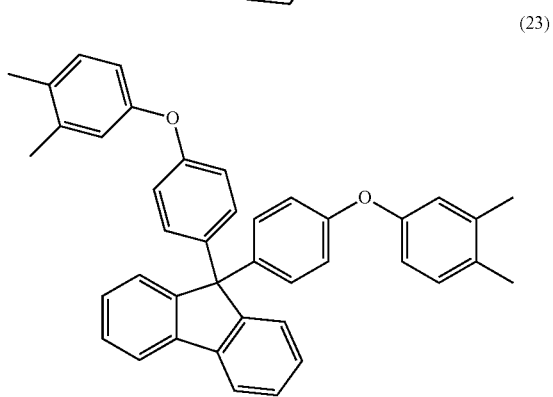

(23)

(24)

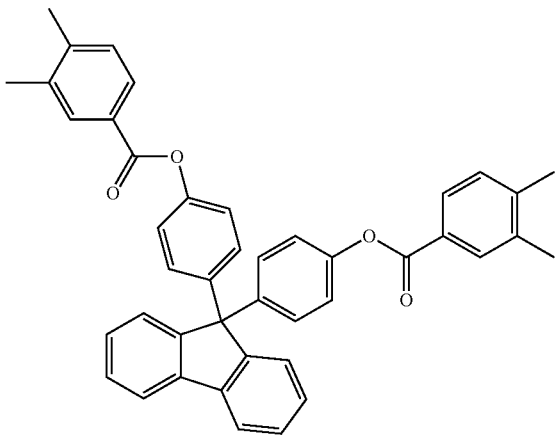

The polyimide precursor according to the present invention may contain other components in addition to the residues listed above unless it does not impair the effect of the invention. Such other components include residues of dianhydrides other than those dianhydrides from which dianhydride residues as represented by Formula (1) or Formula (4) can be derived (such dianhydrides and their residues are referred to as other dianhydrides and other dianhydride residues, respectively), and residues of diamines other than those diamines from which diamine residues as represented by Formula (2) or Formula (3) can be derived (such diamines and their residues are referred to as other diamines and other diamine residues, respectively).

Other dianhydrides include aromatic dianhydrides, alicyclic dianhydrides, and aliphatic dianhydrides.

Such aromatic dianhydrides include pyromellitic dianhydride, 2,3,3',4'-biphenyl tetracarboxylic dianhydride, 2,2',3,3'-biphenyl tetracarboxylic dianhydride, 3,3',4,4'-terphenyl tetracarboxylic dianhydride, 3,3',4,4'-oxy phthalic dianhydride, 2,3,3',4'-oxy phthalic dianhydride, 2,3,2',3'-oxy phthalic dianhydride, diphenyl sulfone-3,3',4,4'-tetracarboxylic dianhydride, benzophenone-3,3',4,4'-tetracarboxylic dianhydride, 2,2-bis(3,4-dicarboxyphenyl) propane dianhydride, 2,2-bis(2,3-dicarboxyphenyl) propane dianhydride, 2,2-bis(4-(3,4-dicarboxyphenoxy) phenyl) propane dianhydride, 1,1-bis(3,4-dicarboxyphenyl) ethane dianhydride, 1,1-bis(2,3-dicarboxyphenyl) ethane dianhydride, bis(3,4-dicarboxyphenyl) methane dianhydride, bis(2,3-dicarboxyphenyl) methane dianhydride, bis(3,4-dicarboxyphenyl) ether dianhydride, 1,4-phenylene bis(1,3-dioxo-1,3-dihydroisobenzofuran-5-carboxylate), 2,2-bis(4-(4-aminophenoxy) phenyl) propane, 1,2,5,6-naphthalene tetracarboxylic dianhydride, 2,3,6,7-naphthalene tetracarboxylic dianhydride, 2,3,5,6-pyridine tetracarboxylic dianhydride, 3,4,9,10-perylene tetracarboxylic dianhydride, 2,2-bis(3,4-dicarboxyphenyl) hexafluoropropane dianhydride, 2,2-bis(4-(3,4-dicarboxybenzoyloxy) phenyl) hexafluoropropane dianhydride, 1,6-difluoropyromellitic dianhydride, 1-trifluoromethyl pyromellitic dianhydride, 1,6-ditrifluoromethyl pyromellitic dianhydride, and 2,2'-bis(trifluoromethyl)-4,4'-bis(3,4-dicarboxyphenoxy) biphenyl dianhydride, though the invention is not limited thereto.

Such alicyclic dianhydrides include 1,2,3,4-cyclobutane tetracarboxylic dianhydride, 1,2,3,4-cyclopentane tetracarboxylic dianhydride, 1,2,4,5-cyclohexane tetracarboxylic dianhydride, 1,2,3,4-cyclopentane tetracarboxylic dianhydride, 1,2,3,4-tetramethyl-1,2,3,4-cyclobutane tetracarboxylic dianhydride, 1,2-dimethyl-1,2,3,4-cyclobutane tetracarboxylic dianhydride, 1,3-dimethyl-1,2,3,4-cyclobutane tetracarboxylic dianhydride, 1,2,3,4-cycloheptane tetracarboxylic dianhydride, 2,3,4,5-tetrahydrofuran tetracarboxylic dianhydride, 3,4-dicarboxy-1-cyclohexyl succinic dianhydride, 2,3,5-tricarboxycyclopentyl acetic dianhydride, 3,4-dicarboxy-1,2,3,4-tetrahydro-1-naphthalene succinic dianhydride, bicyclo[3,3,0]octane-2,4,6,8-tetracarboxylic dianhydride, bicyclo[4,3,0]nonane-2,4,7,9-tetracarboxylic dianhydride, bicyclo[4,4,0]decane-2,4,7,9-tetracarboxylic dianhydride, bicyclo[4,4,0]decane-2,4,8,10-tetracarboxylic dianhydride, tricyclo[6,3,0,0<2,6>]undecane-3,5,9,11-tetracarboxylic dianhydride, bicyclo[2,2,2]octane-2,3,5,6-tetracarboxylic dianhydride, bicyclo[2,2,2]octo-7-en-2,3,5,6-tetracarboxylic dianhydride, bicyclo[2,2,1]heptane tetracarboxylic dianhydride, bicyclo[2,2,1]heptane-5-carboxymethyl-2,3,6-tricarboxylic dianhydride, 7-oxabicyclo[2,2,1]heptane-2,4,6,8-tetracarboxylic dianhydride, octahydronaphthalene-1,2,6,7-tetracarboxylic dianhydride, tetradeca hydroanthracene-1,2,8,9-tetracarboxylic dianhydride, 3,3',4,4'-dicyclohexane tetracarboxylic dianhydride, 3,3',4,4'-oxydicyclohexane tetracarboxylic dianhydride, 5-(2,5-dioxotetrahydro-3-furanyl)-3-methyl-3-cyclohexene-1,2-dicarboxylic anhydride, and Rikacid (registered trademark) BT-100 (trade name, manufactured by New Japan Chemical Co., Ltd.), as well as derivatives thereof, though the invention is not limited thereto.

Such aliphatic dianhydrides include 1,2,3,4-butane tetracarboxylic dianhydride, 1,2,3,4-pentane tetracarboxylic dianhydride, and derivatives thereof, though the invention is not limited thereto.

These aromatic dianhydrides, alicyclic dianhydrides, and aliphatic dianhydrides may be used singly or as a combination of two or more thereof.

Of these, it is preferable from the viewpoint of commercial availability and from the viewpoint of high transparency and low birefringence to further add at least one dianhydride residue selected from the group consisting of 2,2-bis(3,4-dicarboxyphenyl) hexafluoropropane dianhydride (Formula (25)), 3,3',4,4'-oxyphthalic dianhydride (Formula (26)), 2,2-bis(4-(3,4-dicarboxyphenoxy) phenyl) propane dianhydride (Formula (27)), and 1,2,4,5-cyclohexane tetracarboxylic dianhydride (Formula (28)).

[Chemical compound 8]

(25)
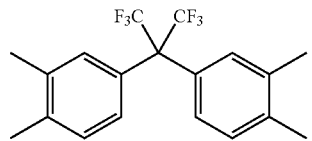

(26)
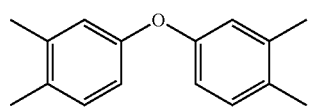

(27)
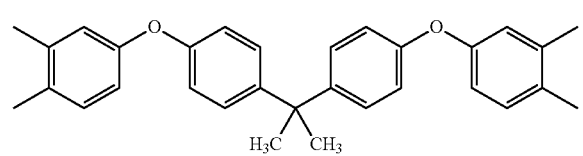

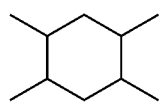
(28)

When a polyimide precursor containing components according to Formulae (1), (2), and (3) is copolymerized with these dianhydrides, a polyimide with a decreased birefringence is obtained even without adding a dianhydride containing a fluorene ring as represented by Formula (4). In addition, a comparison between dianhydrides containing a dianhydride residue as represented by Formula (4) and dianhydrides as represented by Formulae (25) to (28) shows that the latter are better in terms of availability and ability to form a prebaked film with high crack resistance.

There are no specific limitations on the content of the dianhydrides, but it is preferably 10 to 20 mol % of the total quantity of dianhydride residues in the polyimide precursor from the viewpoint of CTE and birefringence, and the number of moles of the diamine residues represented by Formula (3) is preferably equal to or smaller than the total number of moles of the aforementioned at least one dianhydride residues selected from Formulae (25) to (28) from the viewpoint of transparency.

The aforementioned other diamines include aromatic diamine compounds, alicyclic diamine compounds, and aliphatic diamine compounds. The aromatic diamine compounds include, for example, 3,4'-diaminodiphenyl ether, 4,4'-diaminodiphenyl ether, 3,4'-diaminodiphenyl methane, 4,4'-diaminodiphenyl methane, 3,3'-diaminodiphenyl sulfone, 3,4'-diaminodiphenyl sulfone, 4,4'-diaminodiphenyl sulfone, 3,4'-diaminodiphenyl sulfide, 4,4'-diaminodiphenyl sulfide, 1,4-bis(4-aminophenoxy) benzene, benzidine, 2,2'-bis(trifluoromethyl) benzidine, 3,3'-bis(trifluoromethyl) benzidine, 2,2'-dimethyl benzidine, 3,3'-dimethyl benzidine, 2,2'3,3'-tetramethyl benzidine, m-phenylene diamine, p-phenylene diamine, 1,5-naphthalene diamine, 2,6-naphthalene diamine, bis(4-aminophenoxy phenyl) sulfone, bis(3-aminophenoxy phenyl) sulfone, bis(4-aminophenoxy) biphenyl, bis{4-(4-aminophenoxy) phenyl}ether, and 1,4-bis(4-aminophenoxy) benzene, as well as diamine compounds with an alkyl group, alkoxy group, halogen atom, or the like substituted on the aromatic ring thereof, though the invention is not limited thereto.

The alicyclic diamine compounds include, for example, cyclobutane diamine, isophorone diamine, bicyclo[2,2,1]heptane bismethyl amine, tricyclo[3,3,1,13,7]decane-1,3-diamine, 1,2-cyclohexyl diamine, 1,3-cyclohexyl diamine, cis-1,4-cyclohexyl diamine, 4,4'-diaminodicyclohexyl methane, 3,3'-dimethyl-4,4'-diaminodicyclohexyl methane, 3,3'-diethyl-4,4'-diaminodicyclohexyl methane, 3,3',5,5'-tetramethyl-4,4'-diaminodicyclohexyl methane, 3,3',5,5'-tetraethyl-4,4'-diaminodicyclohexyl methane, 3,5-diethyl-3',5'-dimethyl-4,4'-diaminodicyclohexyl methane, 4,4'-diaminodicyclohexyl ether, 3,3'-dimethyl-4,4'-diaminodicyclohexyl ether, 3,3'-diethyl-4,4'-diaminodicyclohexyl ether, 3,3',5,5'-tetramethyl-4,4'-diaminodicyclohexyl ether, 3,3',5,5'-tetraethyl-4,4'-diaminodicyclohexyl ether, 3,5-diethyl-3',5'-dimethyl-4,4'-diaminodicyclohexyl ether, 2,2-bis(4-aminocyclohexyl) propane, 2,2-bis(3-methyl-4-aminocyclohexyl) propane, 2,2-bis(3-ethyl-4-aminocyclohexyl) propane, 2,2-bis(3,5-dimethyl-4-aminocyclohexyl) propane, 2,2-bis(3,5-diethyl-4-aminocyclohexyl) propane, and 2,2-(3,5-diethyl-3',5'-dimethyl-4,4'-diaminodicyclohexyl) propane, as well as diamine compounds with an alkyl group, alkoxy group, halogen atom, or the like substituted on the alicyclic ring thereof, though the invention is not limited thereto.

The aforementioned aliphatic diamine compounds include alkylene diamines such as ethylene diamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane; ethylene glycol diamines such as bis(aminomethyl) ether, bis(2-aminoethyl) ether, and bis(3-aminopropyl) ether; and siloxane diamines such as 1,3-bis(3-aminopropyl) tetramethyl disiloxane, 1,3-bis(4-aminobutyl) tetramethyl disiloxane, and α,ω-bis(3-aminopropyl) polydimethyl siloxane; though the invention is not limited thereto.

These aromatic diamine compounds, alicyclic diamine compounds, and aliphatic diamine compounds can be used singly or as a combination of two or more thereof.

Of these, 2,2'-bis(trifluoromethyl) benzidine, 3,3'-diaminodiphenyl sulfone, 4,4-diaminodiphenyl sulfone, and 4,4'-diaminodicyclohexyl methane are preferable from the viewpoint of commercial availability and from the viewpoint of optical characteristics.

The polyimide precursor according to the present invention may be capped at both ends with an end capping agent to maintain the molecular weight in a preferable range. End capping agents that react with a dianhydride include monoamines and monovalent alcohols. End capping agents that react with a diamine compound include acid anhydrides, monocarboxylic acids, monoacid chloride compounds, monoactive ester compounds, dicarbonic esters, and vinyl ethers. Furthermore, the use of an end capping agent makes it possible to introduce various organic groups as end groups.

Monoamines that can be used as an end capping agent that reacts with an anhydride group include 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic add, 5-aminonicotinic acid, 6-aminonicotinic acid, 4-aminosalicylic acid, 5-aminosalicylic acid, 6-aminosalicylic acid, ameroid, 2-aminobenzoic acid, 3-aminobenzoic acid, 4-aminobenzoic acid, 2-aminobenzene sulfonic acid, 3-aminobenzene sulfonic acid, 4-aminobenzene sulfonic acid, 3-amino-4,6-dihydroxy pyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5- aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynyl aniline, 3-ethynyl aniline, 4-ethynyl aniline, 2,4-diethynyl aniline, 2,5-diethynyl aniline, 2,6-diethynyl aniline, 3,4-diethynyl aniline, 3,5-diethynyl aniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene, and 4,8-diethynyl-2-aminonaphthalene, though the invention is not limited thereto.

Monovalent alcohols that can be used as an end capping agent that reacts with an anhydride group include methanol, ethanol, 1-propanol, 2-propanol, 1-butanol, 2-butanol, 1-pentanol, 2-pentanol, 3-pentanol, 1-hexanol, 2-hexanol, 3-hexanol, 1-heptanal, 2-heptanal, 3-heptanal, 1-octanol, 2-octanol, 3-octanol, 1-nonanol, 2-nonanol, 1-decanol, 2-decanol, 1-uncanol, 2-undecanol, 1-dodecanol, 2-dodecanol, 1-tridecanol, 2-tridecanol, 1-tetradecanol, 2-tetradecanol, 1-pentadecanol, 2-pentadecanol, 1-hexadecanol, 2-hexadecanol, 1-heptadecanol, 2-heptadecanol, 1-octadecanol, 2-octadecanol, 1-nona decanol, 2-nona decanol, 1-eicosanol, 2-methyl-1-propanol, 2-methyl-2-propanol, 2-methyl-1-butanol, 3-methyl-1-butanol, 2-methyl-2-butanol, 3-methyl-2-butanol, 2-propyl-1-pentanol, 2-ethyl-1-hexanol, 4-methyl-3-heptanal, 6-methyl-2-heptanal, 2,4,4-trimethyl-1-hexanol, 2,6-dimethyl-4-heptanal, isononyl alcohol, 3,7-dimethyl-3-octanol, 2,4-dimethyl-1-heptanal, 2-heptyl undecanol, ethylene glycol monoethyl ether, ethylene glycol monomethyl ether, ethylene glycol monobutyl ether, propylene glycol 1-methyl ether, diethylene glycol monoethyl ether, diethylene glycol monomethyl ether, diethylene glycol monobutyl ether, cyclopentanol, cyclohexanol, cyclopentane monomethylol, dicyclopentane monomethylol, tricyclodecane monomethylol, norborneol, and terpineol, though the invention is not limited thereto.

Anhydrides, monocarboxylic acids, monoacid chloride compounds, and monoactive ester compounds that can be used as an end capping agent that reacts with an amino group include anhydrides such as phthalic anhydride, maleic anhydride, nadicanhydride, cyclohexanedicarboxylic anhydride, and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzene sulfonic acid, 3-carboxybenzene sulfonic acid, 4-carboxybenzene sulfonic acid, 2-ethynyl benzoic acid, 3-ethynyl benzoic acid, 4-ethynyl benzoic acid, 2,4-diethynyl benzoic acid, 2,5-diethynyl benzoic acid, 2,6-diethynyl benzoic acid, 3,4-diethynyl benzoic acid, 3,5-diethynyl benzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1-naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid, and 8-ethynyl-2-naphthoic acid; monoacid chloride compounds resulting from acid chloridation of the carboxyl group therein; monoacid chloride compounds resulting from acid chloridation of the monocarboxyl group in a dicarboxylic acid such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene, and 2,7-dicarboxynaphthalene; and active ester compounds resulting from reaction of a monoacid chloride compound with N-hydroxybenzotriazole, N-hydroxy-5-norbornene-2,3-dicarboxyimide, or the like.

Dicarbonic ester compounds that can be used as an end capping agent that reacts with an amino group include di-tert-butyl dicarbonate, dibenzyl dicarbonate, dimethyl dicarbonate, and diethyl dicarbonate.

Vinyl ether compounds that can be used as an end capping agent that reacts with an amino group include chloroformic esters such as tert-butyl chloroformate, n-butyl chloroformate, isobutyl chloroformate, benzyl chloroformate, allyl chloroformate, ethyl chloroformate, and isopropyl chloroformate; isocyanato compounds such as butyl isocyanate, 1-naphthyl isocyanate, octadecyl isocyanate, and phenyl isocyanate; and others such as butyl vinyl ether, cyclohexyl vinyl ether, ethyl vinyl ether, 2-ethylhexyl vinyl ether, isobutyl vinyl ether, isopropyl vinyl ether, n-propyl vinyl ether, tert-butyl vinyl ether, and benzyl vinyl ether.

Other compounds that can be used as an end capping agent that reacts with an amino group include benzyl chloroformate, benzoyl chloride, fluorenyl methyl chloroformate, 2,2,2-trichloroethyl chloroformate, allyl chloroformate, chloride methanesulfonate, chloride p-toluenesulfonate, and phenyl isocyanate.

The end capping agent to be introduced to react with the anhydride group preferably accounts for 0.1 to 60 mol %, more preferably 5 to 50 mol %, relative to the quantity of the dianhydride component. The end capping agent to be introduced to react with the amino group preferably accounts for 0.1 to 100 mol %, more preferably 5 to 90 mol %, relative to the quantity of the diamine component. A plurality of end capping agents may be used to introduce a plurality of end groups.

End capping agents introduced in the polyimide precursor can be detected easily by the methods described below. The polymer containing an end capping agent may be dissolved in, for example, an acidic solution to decompose it into constituent units of the polymer, that is, amine components and acid anhydride components, and then the end capping agent can be detected easily by gas chromatography (GC), NMR spectroscopy, or the like. Another easy detection method is to subject the polymer containing an end capping agent to pyrolysis gas chromatography (PGC), infrared absorption spectrometry, $^{13}C$ NMR spectrometry, etc.

The polyimide precursor according to the present invention is preferably in the form of a polyimide precursor resin composition containing a solvent. Useful solvents include aprotic solvents such as N-methyl-2-pyrolidone, gamma-butyrolactone, N,N-dimethyl formamide, N,N-dimethyl acetamide, N,N'-dimethylpropylene urea, 1,3-dimethyl-2-imidazolidinone, and dimethyl sulfoxide; ethers such as tetrahydrofuran, dioxane and propylene glycol monomethyl ether; ketones such as acetone, methyl ethyl ketone, diisobutyl ketone, and diacetone alcohol; esters such as ethyl acetate, propylene glycol monomethyl ether acetate, and ethyl lactate; and aromatic hydrocarbons such as toluene and xylene, which may be used singly or as a combination of two or more thereof.

The content of the solvent in the polyimide precursor resin composition is preferably 50 parts by weight or more, more preferably 100 parts by weight or more, and preferably 2,000 parts by weight or less, more preferably 1,500 parts by weight or less, relative to 100 parts by weight of the polyimide precursor. If it is in the range of 50 to 2,000 parts by weight, a viscosity suitable for coating can be ensured to allow easy production of a coat with an appropriately controlled thickness.

The polyimide precursor resin composition may contain a surface active agent. Useful surface active agents include fluorochemical surface active agents such as Fluorad (trade name, manufactured by Sumitomo 3M), Megafac (trade name, DIC), and Surflon (trade name, manufactured by Asahi Glass Co., Ltd.). Also useful are organic siloxane surface active agents including KP341 (trade name, manufactured by Shin-Etsu Chemical Co., Ltd.), DBE (trade name, manufactured by Chisso Corporation), Glanol (trade name, manufactured by Kyoeisha Chemical Co., Ltd.), and BYK (manufactured by BYK Japan KK). Others include Emulmin (manufactured by Sanyo Chemical Industries Ltd.) and other surface active agents based on a polyoxyalkylene lauryl ether, polyoxy ethylene lauryl ether, polyoxy ethylene oleyl ether, or polyoxy ethylene cetyl ether. Also useful are acrylic polymer based surface active agents such as Polyflow (trade name, manufactured by Kyoeisha Chemical Co., Ltd.).

These surface active agents preferably account for 0.01 to 10 parts by weight relative to 100 parts by weight of the polyimide precursor in the polyimide precursor resin composition.

The polyimide precursor resin composition may contain an internal mold releasing agent. Useful internal mold releasing agents include long chain fatty acid.

To enhance the adhesion with the support substrate, the polyimide precursor resin composition may contain a silane coupling agent such as trimethoxy aminopropyl silane, trimethoxy epoxy silane, trimethoxy vinyl silane, and trimethoxy thiol propyl silane unless it deteriorates the storage stability. Its content is preferably 0.01 to 5 parts by weight relative to 100 parts by weight of the polyimide precursor.

The polyimide precursor resin composition may contain a thermal crosslinking agent. Preferable thermal crosslinking agents include epoxy compounds and other compounds containing at least two alkoxy methyl groups or methylol groups. The existence of at least two of these groups serves to form a crosslinked structure through condensation reaction among the resin and similar types of molecules, allowing a cured film with improved mechanical strength and chemical resistance to be obtained after heat treatment.

Preferable epoxy compounds that work as thermal crosslinking agent include, for example, bisphenol A type epoxy resin, bisphenol F type epoxy resin, propylene glycol diglycidyl ether, polypropylene glycol diglycidyl ether, polymethyl(glycidyloxypropyl) siloxane, and other epoxy-containing silicones, though the invention is not limited thereto. Specific examples include Epicron 850-S, Epicron HP-4032, Epicron HP-7200, Epicron HP-820, Epicron HP-4700, Epicron EXA-4710, Epicron HP-4770, Epicron EXA-859CRP, Epicron EXA-1514, Epicron EXA-4880, Epicron EXA-4850-150, Epicron EXA-4850-1000, Epicron EXA-4816, and Epicron EXA-4822 (trade names, manufactured by DIC Corporation); Rikaresin BEO-60E, Rikaresin BPO-20E, Rikaresin HBE-100, and Rikaresin DME-100 (trade names, manufactured by New Japan Chemical Co., Ltd.); EP-40035 and EP-4000S (trade names, manufactured by Adeka Corporation); PG-100, CG-500, and EG-200 (trade names, manufactured by Osaka Gas Chemicals Co., Ltd.); NC-3000 and NC-6000 (trade names, manufactured by Nippon Kayaku Co., Ltd.); EPDX-MK R508, EPDX-MK R540, EPDX-MK R710, EPDX-MK R1710, VG3101L, and VG3101M80 (trade names, manufactured by Printech Co., Ltd.); Celoxide 2021P, Celoxide 2081, Celoxide 2083, and Celoxide 2085 (trade names, manufactured by Daicel Chemical Industries, Ltd.).

Such compounds with at least 2 of alkoxy methyl groups and methylol groups that are used as thermal crosslinking agent include, for example, DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TP-PHBA, HML-TPHAP, HMOM-TPPHBA, and HMOM-TP-HAP (trade names, all manufactured by Honshu Chemical Industry Co., Ltd.); and NIKALAC (registered trademark) MX-290, NIKALAC MX-280, NIKALAC MX-270, NIKALAC MX-279, NIKALAC MW-100LM, and NIKALAC MX-750LM (trade names, all manufactured by Sanwa Chemical Co., Ltd.). Two or more thereof may be contained.

These thermal crosslinking agents preferably account for 0.01 to 50 parts by weight relative to 100 parts by weight of the polyimide precursor resin.

The polyimide precursor resin composition may contain an inorganic filler and/or an organo-inorganic filler. Such inorganic fillers include fine silica particles, fine alumina particles, fine titanic particles, and fine zirconia particles.

There are no specific limitations on the shape of such inorganic fillers and they may be spherical, elliptic, flattened, rod-like, or fibrous.

To prevent scattering of light, the inorganic fillers contained are preferably small in particle diameter. Their average particle diameter is in the range of 0.5 to 100 nm, preferably 0.5 to 30 nm.

The inorganic fillers preferably account for 1 to 200 wt %, more preferably 10 wt % or more as lower limit, relative to 100 wt % of the polyimide precursor. With respect to the upper limit, it is more preferably 150 wt % or less, still more preferably 100 wt % or less, particularly preferably 50 wt % or less. An increase in the content leads to a decrease in flexibility and folding endurance.

Various generally known methods are available for the mixing of the polyimide precursor resin composition and inorganic fillers. For example, a useful one is to mix an inorganic filler or an organo-inorganic filler sol with the polyimide precursor. An organo-inorganic filler sol may be prepared by dispersing about 30 wt % of an inorganic filler in an organic solvent, and useful organic solvents include methanol, isopropanol, n-butanol, ethylene glycol, methyl ethyl ketone, methyl isobutyl ketone, propylene glycol monomethyl acetate, propylene glycol monomethyl ether, N,N-dimethyl acetamide, N,N-dimethyl formamide, N-methyl-2-pyrolidone, 1,3-dimethyl imidazolidinone, and gamma-butyl lactone.

Surface treatment of an organo-inorganic filler sol with a silane coupling agent serves to improve the dispersibility of the inorganic filler in the polyimide precursor. If an epoxy group or amino group is contained in the terminal functional group in the silane coupling agent, the carboxylic acid in the polyamic acid may be bonded to the epoxy group or amino group to enhance the affinity with the polyimide precursor or the polyimide obtained by curing, thus ensuring effective dispersion.

Useful silane coupling agents having an epoxy group include 2-(3,4-epoxycyclohexyl) ethyltrimethoxysilane, 3-glycidoxypropyl methyldimethoxysilane, 3-glycidoxypropyl trimethoxysilane, 3-glycidoxypropyl methyldiethoxysilane, and 3-glycidoxypropyl triethoxysilane.

Useful silane coupling agents having an amino group include N-2-(aminoethyl)-3-aminopropyl methyldimethoxysilane, N-2-(aminoethyl)-3-aminopropyl trimethoxysilane, 3-aminopropyl trimethoxysilane, 3-aminopropyl triethoxysilane, 3-triethoxy silyl-N-(1,3-dimethyl-butylidene) propylamine, and N-phenyl-3-aminopropyl trimethoxysilane.

Various generally known methods are available for the treatment of an organo-inorganic filler sol with a silane coupling agent. For example, the treatment may be carried out by adding a silane coupling agent to an organo-inorganic filler sol with an appropriately adjusted concentration and stirring them for 0.5 to 2 hours at a temperature in the range from room temperature to 80° C.

The polyimide precursor resin composition may contain a photoacid generating agent. If a photoacid generating agent is contained, applying a beam through a mask having an exposure pattern works to generate an acid in the exposed part, leading to an increase in the solubility of the exposed part in an aqueous alkali solution. Thus, a polyimide precursor resin composition containing a photoacid generating agent can be used as positive type photosensitive resin. (Hereinafter, a polyimide precursor resin composition containing a photoacid generating agent is occasionally referred to as positive type photosensitive resin composition.) Examples of photoacid generating agents used for this purpose include quinone diazide compounds, sulfonium salts, phosphonium salts, diazonium salts, and iodonium salts. In particular, quinone diazide compounds are preferred because they have a dissolution inhibiting effect and serve to obtain a positive type photosensitive resin composition characterized by high sensitivity and low film loss. Two or more of these photoacid generating agents may be contained. This serves to increase the ratio in dissolution rate between the exposed part and the unexposed part, enabling the production of a positive type photosensitive resin composition having a high sensitivity.

Useful quinone diazide compounds include polyhydroxy compounds bonded to sulfonic acid of quinone diazide through ester linkage, polyamino compounds bonded to sulfonic acid of quinone diazide through sulfonamide linkage, and polyhydroxypolyaminno compounds bonded to sulfonic acid of quinone diazide through ester linkage and/or sulfonamide linkage. It is not necessary for all of the functional groups in the polyhydroxy compounds or polyamino compounds to be substituted by quinone diazide, but it is preferable for 50 mol % or more of the functional groups to be substituted by quinone diazide. The use of such a quinone diazide compound enables the production of a positive type photosensitive resin composition that starts reaction when exposed to commonly used ultraviolet rays such as i-line (wavelength 365 nm), h-line (wavelength 405 nm), and g-line (wavelength 436 nm) of a mercury lamp.

For the quinone diazide compound to be used in this case, both 5-naphthoquinone diazide sulfonyl group and 4-naphthoquinone diazide sulfonyl group are preferred. A compound containing both these groups in one molecule may be used or a plurality of compounds containing different groups may be used in combination.

A quinone diazide compound to be use for such a case can be synthesized from a specific phenol compound by procedures as described below. For example, a useful procedure is to react 5-naphthoquinonediazide sulfonyl chloride with a phenol compound in the presence of triethyl amine. To synthesize a phenol compound, a useful procedure is to react an α-(hydroxyphenyl) styrene derivative with a multivalent phenol compound in the presence of an acid catalyst.

In these cases, the photoacid generating agent used preferably accounts for 3 to 40 parts by weight relative to 100 parts by weight of the polyimide precursor. Adjusting the content of the photoacid generating agent in this range ensures an increased sensitivity In addition, a sensitizing agent and the like may also be contained as required.

To form a pattern of a positive type photosensitive resin composition, a support substrate is coated with a varnish of the positive type photosensitive resin composition, which is then exposed to light, followed by removing the exposed part with a developer solution. Preferable developers include an aqueous solution of alkaline compounds such as tetramethyl ammonium hydroxide, diethanol amine, diethyl aminoethanol, sodium hydroxide, potassium hydroxide, sodium carbonate, potassium carbonate, trimethyl amine, diethyl amine, methyl amine, dimethyl amine, dimethylaminoethyl acetate, dimethyl aminoethanol, dimethylaminoethyl methacrylate, cyclohexyl amine, ethylene diamine, and hexamethylene diamine. In some cases, polar solvents such as N-methyl-2-pyrolidone, N,N-dimethyl formamide, N,N-dimethyl acetamide, dimethyl sulfoxide, gamma-butyrolactone, and dimethyl acrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone may be added singly or in combination to these aqueous alkali solutions. Rinsing in water is preferably performed after the development step. Here again, the water used for rinsing may contain an alcohol such as ethanol and isopropyl alcohol, and an ester such as ethyl lactate and propylene glycol monomethyl ether acetate.

<Polyimide Resin Film>

Described below is the production method for the polyimide precursor according to the present invention. A polyimide precursor such as polyamic acid, polyamic ester, and polyamic acid silyl ester can be synthesized through a reaction of a diamine compound and a dianhydride or a derivative thereof. Useful derivatives include tetracarboxylic acids and acid chlorides of dianhydrides as given above and mono-, di-, tri-, or tetra-esters of a tetracarboxylic acid and more specifically, those having a structure esterified by a methyl group, ethyl group, n-propyl group, isopropyl group, n-butyl group, sec-butyl group, tert-butyl group, or the like. There are no specific limitations on the method used for the polymerization reaction, and generally known reaction methods can be used as long as the intended polyimide precursor can be produced.

Specifically, a useful reaction method is to predetermined quantities of all diamine components and a reaction solvent are fed to a reaction vessel and dissolved and then a predetermined quantity of a dianhydride component is added, followed by stirring for 0.5 to 30 hours at a temperature in the range from room temperature to 80° C.

Described below is a method to produce a polyimide resin film from a polyimide precursor resin composition containing the polyimide precursor according to the present invention and a solvent. Here, the polyimide resin film may contain a surface active agent, internal mold releasing agent, silane coupling agent, thermal crosslinking agent, inorganic filler, photoacid generating agent, etc., as described previously.

First, the polyimide precursor resin composition is spread over a support substrate to produce a film of the polyimide precursor resin composition. Materials used for the support substrate include, but not limited to, silicon, various ceramics, gallium arsenide, soda-lime glass, and non-alkali glass. Useful coating methods include, for example, slit coating, spin coating, spray coating, roll coating, and bar coating, which may be used in combination to perform the coating. Of these, the use of spin coating or slit coating is preferred.

Then, the polyimide precursor resin composition spread over the support substrate is dried to produce a polyimide precursor resin film. Drying is carried out by using a hot plate, oven, infrared ray, vacuum chamber, and the like. When using a hot plate, the support substrate coated with the polyimide precursor resin composition is put directly on the plate or held on jigs such as proxy pins fixed on the plate while heating. There are various proxy pins of different materials including metals such as aluminum and stainless steel and synthetic resins such as polyimide resin and Teflon (registered trademark), but any type of proxy pin may be adopted. The height of the proxy pins depends on the size of the support substrate, type of the resin layer to be heated, purpose of heating, etc., but when, for example, a resin layer spread over a glass support substrate with a size of 300 mm×350 mm×0.7 mm is to be heated, the proxy pins preferably have a height of about 2 to 12 mm.

In particular, it is preferable to perform vacuum-drying in a vacuum chamber, and it is more preferable to perform heating for additional drying after the vacuum-drying or perform heating for additional drying during the vacuum-drying. This enables shortening of the drying treatment time and formation of a uniform coating film. Depending on the type and purpose of the support substrate and polyimide precursor, the heating for drying is performed preferably at a temperature in the range from room temperature to 170° C. for one minute to several hours. The drying step, furthermore, may be repeated a plurality of times under the same conditions or different conditions.

Next, heating is performed for imidization. The polyimide precursor resin film is heated in the range of 180° C. or more and 400° C. or less to achieve its conversion into a polyimide resin film. After the drying step, some other steps may be performed before the thermal imidization step.

There are no specific limitations on the atmosphere for the thermal imidization step and it may be performed in air, nitrogen, argon, or other inert gases. However, the polyimide resin film according to the present invention is required to be colorless and transparent and accordingly, it is preferable to carry out the thermal imidization by heating in an atmosphere with an oxygen concentration of 5% or less. In general, decreasing the oxygen concentration works to reduce the coloring of the polyimide film during the heating step, thereby providing a polyimide resin film with high transparency.

For the thermal imidization step, an appropriate heating method may be selected to work effectively in combination with the heating method used in the ovens in the production line, but it is preferable to increase the temperature by continuing heating for 5 to 120 min to reach the maximum heating temperature. For example, the temperature of the polyimide precursor resin film formed on the base material may be raised in an oven from room temperature to the heating temperature required for thermal imidization by heating for 5 to 120 minutes to ensure imidization for production of a polyimide resin film or may be putting the polyimide precursor resin film formed on the base material directly into an oven heated in advance in the range of 200° C. or more and 650° C. or less to carry out heat treatment to ensure imidization for production of a polyimide resin film.

To peel off the polyimide resin film formed on the support substrate from the support substrate, there are some useful methods including mechanical peeling, immersion in water or chemicals such as hydrofluoric acid, and application of a laser beam to the interface between the cured film and the support substrate, any of which will work appropriately.

The polyimide resin film thus obtained has high transparency, low birefringence, low CTE, high heat resistance, chemical resistance, and flexibility, and serves to produce flexible substrates that can be used suitably in display elements as described later such as liquid crystal display, organic EL display, and electronic paper, optical elements such as color filter and optical waveguide, light receiving elements such as solar battery and CMOS, and others such as touch screen and circuit board.

The transparency of a polyimide resin film can be determined from measured ultraviolet-visible (UV-vis) spectra. The transparent resin film preferably has a light transmittance of 70% or more, more preferably 80% or more, still more preferably 90% or more, as measured under the conditions of a film thickness of 10 μm and a wavelength of 400 nm.

The polyimide resin film according to the present invention preferably has a birefringence of 0.06 or less. The birefringence is defined as the difference in refractive index between the perpendicular direction and the horizontal direction relative to the film surface. With respect to the coefficient of linear thermal expansion (CTE), it is preferable for its average over the range from 50° C. to 200° C. to be 40 ppm/° C. or less. The birefringence is preferably 0.04 or less and the CTE is preferably 40 ppm/° C. or less whereas the birefringence is more preferably 0.04 or less and the CTE is more preferably 30 ppm/° C. or less.

In general, a polyimide resin film produced on a support substrate tends to suffer from residual stress that causes warping of the support substrate. Warping of the support substrate can cause problems such as a decrease in accuracy in processing elements and errors in conveyance in element processing steps. Residual stress in the polyimide resin film is attributed mainly to the difference in CTE between the support substrate and the polyimide resin film, and the residual stress increases with an increasing difference in CTE between them. In general, a glass substrate, which is lower in CTE than the polyimide resin film, is used as the support substrate and accordingly, the polyimide resin film is also required to be low in CTE. As compared with this, the substrates used in display elements of display substrates etc. or optical elements of color filters etc. are required to be low in birefringence. For example, displays equipped with display elements or color filters that use a high-birefringence substrate suffer from problems such as image distortion and color drift in oblique visual fields. Having a low CTE and a low birefringence in a good balance, the polyimide resin film according to the present invention can achieve a high processing accuracy and a high display image quality at the same time.

With respect to chemical resistance, polyimide formed from the polyimide precursor according to the present invention is very high in chemical resistance to organic solvents such as acetone, propylene glycol monomethyl ether, N-methyl-2-pyrolidone, gam ma-butyrolactone, and dimethyl sulfoxide; acidic solutions such as hydrochloric acid, nitric acid, phosphoric acid, acetic acid, and oxalic acid; and basic solutions such as tetramethyl ammonium hydroxide.

With respect to these physical properties, when a polyimide resin film contains an surface active agent, internal mold releasing agent, silane coupling agent, thermal crosslinking agent, inorganic filler, photoacid generating agent, etc., it is subjected to measurement to determine the physical properties without removing them from the resin film.

The polyimide resin film according to the present invention can be used in display elements such as liquid crystal display, organic EL display, and electronic paper, optical elements such as color filter and optical waveguide, light-receiving elements such as solar battery and CMOS, and others such as touch screen and circuit substrate. When applying these display elements and light-receiving elements to development of soft, highly bendable or foldable flexible elements, the polyimide resin film according to the present invention can be used suitably as flexible substrate. Hereinafter, display elements and optical elements (color filters etc.) that contains the polyimide resin film according to the present invention as flexible substrate are occasionally referred to as flexible display elements and flexible optical elements (flexible color filters etc.) with "flexible" prefixed to the names of elements.

To produce a display element, light-receiving element, circuit, TFT substrate, or the like, a polyimide resin film is formed first on a support substrate and then the production steps may be carried out on the polyimide resin film after removing the polyimide resin film from the support substrate or may be carried out on the polyimide resin film without removing it from the support substrate.

In the latter case, the display element, light-receiving element, circuit, or TFT substrate is removed from the support substrate after their production. This method has the advantage that the conventional sheet-fed production process can be used. Furthermore, the polyimide resin film is fixed on the support substrate and it is advantageous for maintaining high positional accuracy in producing a display element, light-receiving element, circuit, TFT substrate, touch screen, or the like. Hereinafter, the latter process is mostly cited in explaining the invention, but the former can also be applied in all cases.

There are no specific limitations on the method to be used for removing the polyimide resin film from the base material after producing a display element, light-receiving element, circuit, TFT substrate, touch screen, or the like on top of it. Useful removal techniques include immersion in water, immersion in hydrochloric acid, hydrofluoric acid, or other chemicals, and application of a laser beam in the wavelength range from ultraviolet to infrared to the interface between the polyimide resin film and the support substrate. Here, in order to ensure easy removal, a mold releasing agent may be applied or a sacrifice layer may be formed over the support substrate before spreading the polyimide precursor resin composition over the base material. Useful mold releasing agents include vegetable oil based, alkyd based, silicone based, fluorine based, aromatic polymer based, and alkoxysilane based ones. Useful sacrifice layers include metal film, metal oxide film, and amorphous silicon film.

For the polyimide resin film according to the present invention, an inorganic film that works as a gas barrier layer may be formed at least on either side to provide a substrate provided with a gas barrier layer that can be used suitably as substrate in display elements.

Such a gas barrier layer on the polyimide resin film is intended for prevention of the permeation of water vapor, oxygen, and the like. Organic electroluminescence elements (organic EL emission elements), in particular, tend to suffer from serious degradation due to moisture and therefore, it is necessary for the substrate to have gas barrier properties.

<Flexible Substrate>

Substrates containing the polyimide resin film according to the present invention have the feature of being flexible and able to be bended largely. A substrate having such flexibility is referred to as a flexible substrate. A flexible substrate can be produced through at least the following steps from (1) to (3). Furthermore, a flexible substrate containing an inorganic film on top of the polyimide resin film can be produced through at least the following steps from (1) to (4).

(1) A step for coating a support substrate with a polyimide precursor resin composition that contains the polyimide precursor according to the present invention and a solvent.

(2) A step for removing the solvent from the coating of the polyimide precursor resin composition.

(3) A step for imidizing the polyimide precursor to form a polyimide resin film.

(4) A step for forming an inorganic film on top of the polyimide resin film.

The steps from (1) to (3) are as described in detail in section <Polyimide resin film>.

In step (4) described above, an inorganic film is formed at least on either side of the polyimide resin film. A flexible substrate can be produced by removing the polyimide resin film from the support substrate.

Note that in step (4), the inorganic film may be formed directly on the polyimide resin film or the inorganic film may be formed after forming another layer to interpose in between. It is preferable for the inorganic film to be formed directly on the polyimide resin film.

A support substrate to be used for producing a flexible substrate is preferably a self-standable, rigid, heat-resistant one having a smooth surface suitable for coating with a resin composition. There are no specific limitations on the material, and useful materials include, for example, ceramics such as soda glass, non-alkali glass, silicon, quartz, alumina, and sapphire, metals such as gallium arsenide, iron, tin, zinc, copper, aluminum, and stainless steel, heat resistant plastics such as polyimide and polybenzooxazole, fluorine resins such as polytetrafluoroethylene and polyvinylidene fluoride, and others such as epoxy resin, polyethylene terephthalate, and polyethylene naphthalate. Of these, glass is preferable because of surface smoothness, suitability for removal by laser, and low price. There are no specific limitations on the type of glass, but non-alkali glass is preferable from the viewpoint of metal impurity reduction.

As described above, when a flexible substrate is to be used as substrate for display elements, it is preferable to form an inorganic film on the polyimide resin film because the substrate is required to have gas barrier properties. Preferable materials for the inorganic film that acts as a gas barrier layer include metal oxides, metal nitrides, and metal oxynitrides. Specifically, they include, for example, metal oxides, metal nitrides, and metal oxynitrides of aluminum (Al), silicon (Si), titanium (Ti), tin (Sn), zinc (Zn), zirconium (Zr), indium (In), niobium (Nb), molybdenum (Mo), tantalum (Ta), and calcium (Ca). In particular, gas barrier layers containing at least metal oxides, metal nitrides, or metal oxynitrides of Zn, Sn, or In are preferable because they are generally high in flex resistance. Furthermore, gas barrier layers in which Zn, Sn, and In have an atom concentration of 20 to 40% are preferable because they are generally higher in flex resistance. Gas barrier layers in which silicon dioxide or aluminum oxide coexists are also preferable because of high flex resistance.

These inorganic gas barrier layers can be produced by a vapor phase deposition technique, in which gas-phase material is deposited to form a film, such as, for example, sputtering, vacuum deposition, ion plating, and plasma CVD. For sputtering, in particular, the reactive sputtering technique, in which a metal target is sputtered in an oxygen containing atmosphere, can serve to improve the film production speed.

A gas barrier layer may be formed on a layered body formed of a support substrate and a polyimide resin film or on a self-standing film removed from the support substrate.

Since the polyimide resin according to the present invention is high in heat resistance, it is possible to produce a gas barrier layer at an elevated substrate temperature. The film production temperature to form a gas barrier layer is preferably 80° C. to 400° C. To improve the gas barrier properties, it is advantageous to use a high film production temperature. A high film production temperature can lead to a low flex resistance and accordingly, the film production temperature for a gas barrier layer is preferably 100° C. to 300° C. when flex resistance is important. Since the polyimide resin film according to the present invention is high in heat resistance, the film does not suffer from defects such as wrinkles even if a gas barrier layer is produced at a high temperature (for example 300° C.).

There are no specific limitations on the number of gas barrier layers and it may be possible to adopt a single layer structure or a multiple (two or more) layer structure. In the case of a multiple layer structure, a gas barrier layer may contain the first layer of SiO and the second layer of SiN or a gas barrier layer may contain the first layer of SiO/AlO/ZnO and the second layer of SiO.

Various organic solvents are used in a process in which various functional layers such as organic EL luminescence layer are formed on the gas barrier layer in a flexible substrate in producing a display element or optical element. In the case of color filters (hereinafter abbreviated as CFs), for example, a gas barrier layer is formed on a polyimide resin film, and colored pixels, black matrix, and the like are formed on top of it to produce a CF. In this instance, the gas barrier layer will be poor in gas barrier properties if it is low in solvent resistance. Therefore, it is preferable for the topmost gas barrier layer to have solvent resistance and, for example, the topmost gas barrier layer is of silicon oxide.

The composition analysis of a gas barrier layer can be performed based on quantitative analysis of each substance by X-ray photoelectron spectroscopy (XPS).

The total thickness of the gas barrier layers is preferably 20 to 600 nm, more preferably 30 to 300 nm.

The thickness of gas barrier layers can be commonly determined from cross-sectional observations by transmission electron microscopy (TEM).

In the case where the interface between a upper and a lower gas barrier layer cannot be identified clearly by TEM because, for example, the composition varies in an inclined direction in the boundary region, composition analysis is first performed in the thickness direction to determine the concentration distribution of each substance in the thickness direction and then the interface and layer thickness are determined based on the data of concentration distribution. The procedure for composition analysis in the thickness direction and the definitions of the interlayer boundary and layer thickness are described below.

First, the cross section of each gas barrier layer is observed by transmission electron microscopy to determine the overall thickness. Then, the undermentioned measurements that enables the composition analysis of substances in the depth direction are used to obtain concentration distributions of substances at various depth positions (thickness-directional concentration profile) in the gas barrier layer. Useful composition analysis methods for this include electronic energy loss spectroscopy (hereinafter referred to as EELS analysis), energy dispersive X-ray spectroscopy (hereinafter referred to as EDX analysis), secondary ion mass analysis (hereinafter referred to as SIMS analysis), X-ray photoelectron spectroscopy (hereinafter referred to as XPS analysis), and Auger electronic spectroscopy (hereinafter referred to AES analysis), of which EELS analysis is the most preferable from the viewpoint of sensitivity and accuracy. Accordingly, EELS analysis is performed first, followed by other analyses in the order mentioned above (EELS analysis-->EDX analysis-->SIMS analysis-->XPS analysis-->AES analysis) and data for substances that cannot be identified by an upper-level analysis are compensated by a lower level analysis.

<CF>

A CF can be produced by forming a black matrix and colored pixels on a flexible substrate produced from the polyimide resin film according to the present invention. This CF contains resin film as base material and therefore has the feature of being lightweight, crack-resistant, and flexible. Of the resins used in the black matrix and colored pixel layers, it is preferable that a resin used at least in one layer contain polyimide resin. From the viewpoint of reflectance reduction and heat resistance, furthermore, it is preferable that the black matrix contain a low optical density layer and a high optical density layer formed on the low optical density layer and that a resin contained in at least either the low optical density layer or the high optical density layer contain polyimide resin.

The polyimide resin film according to the present invention has high chemical resistance to polar aprotic solvents that are generally used as solvents for polyimide precursors and therefore, the polyimide resin can be used in black matrix and colored pixel layers. In the case where a gas barrier layer is formed on a black matrix or colored pixel layer, furthermore, the polyimide resin in the black matrix and colored pixel layers are so high in heat resistance that the quantity of gas generation is small in the gas barrier layer formation process, which is advantageous for the production of gas barrier layers with good gas barrier properties. In the patterning steps for the black matrix and colored pixel layers, furthermore, it serves a polyimide precursor that is soluble in aqueous alkali solutions, which is advantageous for fine patterning.

Typical constitutions of CFs are explained below with reference to drawings. FIG. 1A illustrates the basic structure of a CF that contains the polyimide resin film according to the present invention, which is formed on a support substrate. A CF containing the polyimide resin film according to the present invention as substrate can be obtained by removing support substrate 1 from this by a substrate removal technique as described previously.

A polyimide resin film 2 is formed on a support substrate 1, and a black matrix 4, red colored pixel 5R, green colored pixel 5G, and blue colored pixel 5B are formed on top of it and covered by an overcoat layer 6. Here, the overcoat layer 6 is not essential and not necessarily provided. As compared with FIG. 1A, FIGS. 1B to 1D show modified examples, each containing an inorganic film, that is, the gas barrier layer 3. There are no specific limitations on the position of the gas barrier layer 3 and it may be formed, for example, on the polyimide resin film 2 (see FIG. 1B), on the black matrix 4 and colored pixel layer (see FIG. 1C), on the overcoat layer 6 located at the surface of the color filter, or on both the polyimide resin film 2 and the overcoat layer 6 (see FIG. 1D). There are no specific limitations on the number of gas barrier layers and it may be possible to adopt a single layer structure or a multiple (two or more) layer structure. In the case of a multiple layer structure, a gas barrier layer may contain the first layer of SiO and the second layer of SiN or a gas barrier layer may contain the first layer of SiO/AlO/ZnO and the second layer of SiO.

(Black Matrix)

The black matrix is preferably one that is formed mainly of resin in which black pigments are dispersed. Useful materials for the black pigments include, for example, carbon black, titanium black, titanium oxide, titanium oxynitride, titanium nitride, and iron tetroxide. In particular, carbon black and titanium black are preferred. A black pigment may be produced by mixing red, green, and blue pigments.

The resin to form the resin black matrix is preferably polyimide resin from the viewpoint of heat resistance and the easiness of forming a fine pattern. A preferred method for producing the polyimide resin layer is to synthesize polyamic acid from a dianhydride and diamine and then pattern it, followed by heat curing for conversion into polyimide resin.

Useful dianhydrides, diamines, and solvents are the same as those listed previously for polyimide resin.

Useful resins for the resin black matrix also include photosensitive acrylic resins. They are formed of alkali-soluble acrylic resin that contains dispersed black pigments, photopolymerizable monomers, polymer dispersing agent, and additives.

Examples of alkali-soluble acrylic resin include copolymers of an unsaturated carboxylic acid and an unsaturated ethylene compound. Examples of the unsaturated carboxylic acid include acrylic acid, methacrylic acid, itaconic acid, crotonic acid, maleic acid, fumaric acid, vinyl acetic acid, and acid anhydrides thereof.

Examples of the photopolymerizable monomers include trimethylolpropane tri(meth)acrylate, pentaerythritol tri(meth)acrylate, triacrylic formal, pentaerythritol tetra(meth)acrylate, dipentaerythritol hexa(meth)acrylate, and dipentaerythritol penta(meth)acrylate.

Useful photopolymerization initiators include benzophenone, N,N'-tetraethyl-4,4'-diaminobenzophenone, 4-methoxy-4'-dimethyl aminobenzophenone, 2,2-diethoxy-acetophenone, α-hydroxyisobutylphenon, thioxanthone, and 2-chlorothioxanthone.

Useful solvents to dissolve the photosensitive acrylic resin include propylene glycol monomethyl ether acetate, propylene glycol monoethyl ether acetate, acetoethyl acetate, methyl-3-methoxy propionate, ethyl-3-ethoxy propionate, methoxy butyl acetate, and 3-methyl-3-methoxy butyl acetate.

To prevent visibility deterioration attributed to external light reflection, the black matrix is preferably in the form of a layered resin black matrix that contains a low optical density layer and a high optical density layer formed on the low optical density layer. Here, a low optical density layer is one that has a layer structure that has a non-zero optical density and is substantially not transparent and has an optical density per unit thickness that is smaller than the optical density per unit thickness of the high optical density layer. There are no specific limitations on the type of resin used to constitute the layered resin black matrix, but it is preferable for the low optical density layer and the high optical density layer to be of polyimide resin and acrylic resin, respectively, from the viewpoint of simultaneous patterning of the low optical density layer and the high optical density layer. The resin black matrix preferably contain fine particles to decrease the reflectance.

(Colored Pixel)

Colored pixels are formed after forming a black matrix. The colored pixels consist mainly of three types of colored pixels, namely, red, green, and blue ones. In addition to the three types of colored pixels, a fourth type of pixels, namely, colorless transparent ones or slightly colored ones, may be added with the aim of improving the luminance of the white color in display elements.

The colored pixels in a color filter may be formed of resin that contains a pigment or dye as the coloring agent.

Useful pigments for the red colored pixels include PR254, PR149, PR166, PR177, PR209, PY138, PY150, and PYP139; useful pigments for the green colored pixels include PG7, PG36, PG58, PG37, PB16, PY129, PY138, PY139, PY150, and PY185; and useful pigments for the blue colored pixels include PB15:6 and PV23.

Examples of the blue dyes include C. I. Basic Blue (BB) 5, BB7, BB9, and BB26; examples of the red dyes include C. I. Acid Red (AR) 51, AR87, and AR289; and examples of the green dyes include C. I. Acid Green (AG) 25 and AG27.

Useful resins for the red, green, and blue colored pixels include acrylic based resins, epoxy based resins, and polyimide based resins. From the viewpoint of heat resistance, the use of polyimide resin is preferred and photosensitive acrylic based resin may be adopted to reduce the CF production cost.

A commonly used method for producing colored pixels of polyimide resin is to coat a substrate with a nonphotosensitive color paste containing at least polyamic acid, a coloring agent, and a solvent, dry it by air-drying, heat drying, or vacuum-drying to form a colored film of nonphotosensitive polyamic acid, which is then patterned as desired using a positive type photoresist, followed by removing the photoresist with alkali and finally heating it at 200° C. to 300° C. for 1 to 3 hours to cure (polyimidize) the colored pixels.

In general, the photosensitive acrylic based resin used contains alkali-soluble acrylic resin, photopolymerizable monomers, and a photopolymerization initiator.

Examples of the alkali-soluble acrylic resin include copolymers of an unsaturated carboxylic acid and an unsaturated ethylene compound. Examples of the unsaturated carboxylic acid include acrylic acid, methacrylic acid, itaconic acid, crotonic acid, maleic acid, fumaric acid, vinyl acetic acid, and acid anhydrides thereof.

Examples of the photopolymerizable monomers include trimethylolpropane tri(meth)acrylate, pentaerythritol tri(meth)acrylate, triacrylic formal, pentaerythritol tetra(meth)acrylate, dipentaerythritol hexa(meth)acrylate, and dipentaerythritol penta(meth)acrylate.

Useful photopolymerization initiators include benzophenone, N,N'-tetraethyl-4,4'-diaminobenzophenone, 4-methoxy-4'-dimethyl aminobenzophenone, 2,2-diethoxyacetophenone, α-hydroxyisobutylphenon, thioxanthone, and 2-chlorothioxanthone.

Useful solvents to dissolve the photosensitive acrylic based resin include propylene glycol monomethyl ether acetate, propylene glycol monoethyl ether acetate, acetoethyl acetate, methyl-3-methoxy propionate, ethyl-3-ethoxy propionate, methoxy butyl acetate, and 3-methyl-3-methoxy butyl acetate The surface of the color filter containing the black matrix and colored pixels formed above may be planarized by further forming an overcoat layer on the surface of the color filter. Examples of the resin used to form an overcoat layer include epoxy resin, acrylic epoxy resin, acrylic resin, siloxane resin, and polyimide resin. The overcoat layer preferably has such a thickness as to make the surface flat and the thickness is preferably 0.5 to 5.0 µm, more preferably 1.0 to 3.0 µm.

(CF Production Method)

A CF including the polyimide resin film according to the present invention can be produced at least by the following steps.
(1) A step for coating a support substrate with a polyimide precursor resin composition that contains the polyimide precursor according to the present invention and a solvent.
(2) A step for removing the solvent from the coating of the polyimide precursor resin composition.
(3) A step for imidizing the polyimide precursor to form a polyimide resin film.
(4) A step for forming a black matrix and colored pixels on top of the polyimide resin film.
(5) A step for removing the polyimide resin film from the support substrate. The steps from (1) to (3) are as described in detail in section <Polyimide resin film>.

In step (4) described above, a black matrix and colored pixels are formed on the polyimide resin film. As described later, photolithography is performed for the patterning of the black matrix and colored pixels. Currently, liquid crystal displays and organic EL displays are required to have a high resolution of 300 ppi or more and the same or higher level quality is called for in flexible display panels. The achievement of such a high resolution requires a high-accuracy patterning technique. When a CF is produced by coating a support substrate with polyimide resin and forming a black matrix etc. on top of it, the currently used technique of using a glass substrate as the support substrate and forming a black matrix etc. on it to produce a CF can be applied and this is advantageous for high-definition patterning as compared with producing a CF on a self-standing polyimide film.

Note that in step (4), the black matrix and colored pixels may be formed directly on the polyimide resin film or they may be formed after forming another layer to interpose in between.

The CF production process may further contain a step for producing an inorganic film such as gas barrier layer. There are no specific limitations on the position where an inorganic film is to be formed. For example, such a film may be formed on the polyimide resin film, on the black matrix and colored pixel layer, on the planarizing film located on the surface of the color filter, or on both the polyimide resin film and the planarizing film. There are no specific limitations on the number of inorganic films and it may be possible to adopt a single layer structure or a multiple (two or more) layer structure. In the case of a multiple layer structure, an inorganic film may contain the first layer of SiO and the second layer of SiN or an inorganic film may contain the first layer of SiO/AlO/ZnO and the second layer of SiO.

A typical method for producing a CF according to the present invention is described in detail below. A polyimide resin film and a gas barrier layer are formed on a support substrate by the method described above. On top of it, a paste for black matrix formation comprised mainly of polyamic acid in which pigments of black carbon black or titanium black are dispersed is spread by a technique such as the use of a spin coater, die coater, or the like in such a manner that the thickness will be 1 µm after curing, followed by drying under a reduced pressure of 60 Pa or less and semicuring at 110° C. to 140° C. in a hot air oven or on a hot plate.

A positive type resist is spread by a technique such as the use of a spin coater, die coater, or the like in such a manner that the thickness will be 1.2 µm after prebaking, followed by drying under a reduced pressure down to 80 Pa and prebaking at 80° C. to 110° C. in a hot air oven or on a hot plate to produce a resist film. Subsequently, the film is exposed selectively to an ultraviolet ray through a photomask using, for example, a proximity exposure apparatus or projection exposure apparatus and immersed in an alkali developer containing 1.5 to 3 wt % potassium hydroxide, tetramethyl ammonium hydroxide, or the like for 20 to 300 seconds to remove the exposed part. The positive type resist is removed with a stripping liquid and then the film is heated at 200° C. to 300° C. in a hot air oven or on a hot plate for 10 to 60 minutes to convert the polyamic acid into polyimide, thereby forming a resin black matrix.

Colored pixels are formed using coloring agents and resin. When a pigment is used as the coloring agent, the pigment is mixed with a polymer dispersing agent and solvent and subjected to dispersion treatment to prepare a dispersion liquid, followed by adding polyamic acid. When a dye is used as the coloring agent, on the other hand, the dye is mixed with a solvent and polyamic acid. In this case, the total solid content refers to the total content of the polymer dispersing agent, polyamic acid, and coloring agents that are components of the resin.

The resulting coloring agent composition is spread over the polyimide resin film that carries the resin black matrix by a technique such as the use of a spin coater, die coater, or the like in such a manner that the thickness will reach an intended value of 0.8 µm to 3.0 µm after heating, followed by drying under a reduced pressure down to 80 Pa and prebaking at 80° C. to 110° C. in a hot air oven or on a hot plate to produce a coat film of the coloring agent.

Then, a positive type resist is spread by a technique such as the use of a spin coater, die coater, or the like in such a manner that the thickness will be 1.2 µm after prebaking, followed by drying under a reduced pressure down to 80 Pa and prebaking at 80° C. to 110° C. in a hot air oven or on a hot plate to produce a resist film. Subsequently, the film is exposed selectively to an ultraviolet ray through a photomask using, for example, a proximity exposure apparatus or projection exposure apparatus and immersed in an alkali developer containing 1.5 to 3 wt % potassium hydroxide, tetramethyl ammonium hydroxide, or the like for 20 to 300 seconds to remove the exposed part. The positive type resist is removed with a stripping liquid and then the film is heated at 200° C. to 300° C. in a hot air oven or on a hot plate for 10 to 60 minutes to convert the polyamic acid into polyimide, thereby forming a colored pixel. Using coloring agent compositions prepared for colored pixels of different colors, the patterning step described above is performed to form a red colored pixel, green colored pixel, and blue colored pixel. Here, there are no specific limitations on the order of producing colored pixels.

Subsequently, polysiloxane resin is spread by a technique such as the use of a spin coater, die coater, or the like, followed by vacuum-drying, prebaking at 80° C. to 110° C. in a hot air oven or on a hot plate, and heating at 150° C. to 250° C. for 5 to 40 minutes in a hot air oven or on a hot plate to form an overcoat layer, thereby producing a pixel for the CF according to the present invention.

As described above, the polyimide resin film according to the present invention is so low in CTE that the substrate does not warp significantly when a polyimide resin film is produced on a support substrate. Therefore, this serves to reduce the defocusing that can occur when forming a black matrix or colored pixel by photolithography, thereby ensuring a high-accuracy CF production.

<TFT Substrate>

The polyimide resin film according to the present invention can be used suitably as material for TFT substrates. Specifically, it is possible to obtain a TFT substrate in which a TFT is provided on the polyimide resin film according to the present invention. This TFT substrate contains resin film as base material and therefore has the feature of being lightweight and crack-resistant.

A TFT substrate including the polyimide resin film according to the present invention can be produced at least by the following steps.

(1) A step for coating a support substrate with a polyimide precursor resin composition that contains the polyimide precursor according to the present invention and a solvent.
(2) A step for removing the solvent from the coating of the polyimide precursor resin composition.
(3) A step for imidizing the polyimide precursor to form a polyimide resin film.
(4) A step for forming a gas barrier layer on top of the polyimide resin film.
(5) A step for forming a TFT on top of the polyimide resin film.

The steps from (1) to (3) are as described in detail in section <Polyimide resin film>.

Steps (4) and (5) given above are designed to form a gas barrier layer on a polyimide resin film and subsequently form a TFT. Note that in steps (4) and (5), the gas barrier layer and TFT may be formed directly on the polyimide resin film or they may be formed after forming another layer to interpose in between. It is preferable to form a gas barrier layer directly on the polyimide resin film, followed by forming a TFT on top of it.

The semiconductor layer used for the TFT formation may be of an amorphous silicon semiconductor, polycrystalline silicon semiconductor, oxide semiconductor such as In—Ga—$ZnO_4$, or organic substance semiconductor such as pentacene and polythiophene. For example, a bottom gate type TFT may be produced by using the polyimide resin film according to the present invention as base and forming a gas barrier film, gate electrode, gate insulation film, semiconductor layer, etching stopper film, and source/drain electrodes in this order by generally known methods. A TFT substrate based on a polyimide resin film can be produced by the aforementioned steps. Such a TFT substrate can be used as drive substrate for display elements such as liquid crystal element, organic EL emission element, and electronic paper.

In the TFT substrate production, photolithography is mainly adopted to form a gate electrode, gate insulation film, semiconductor layer, etching stopper film, and source/drain electrodes. As described above, the polyimide resin film according to the present invention is so low in CTE that the substrate does not warp significantly when a polyimide resin film is produced on a support substrate. Accordingly, defocusing that can occur in the photolithography step can be reduced to serve to improve the accuracy in the TFT production process. As a result, a TFT substrate with high drive performance will be obtained. In the case of a bottom emission type organic EL display, for example, the user of the display sees the beam after passing through the TFT substrate. Therefore, the use of a resin with large birefringence as base material of the TFT substrate will cause problems such as color drift when looked in an oblique direction. The polyimide resin film according to the present invention is smaller in birefringence than the conventional low CTE/transparent polyimide resins and can serve to solve these problems.

<Touch Screen>

A flexible substrate that adopts the polyimide resin film according to the present invention can serve as substrate for a touch screen. For example, a touch screen can be produced by forming a transparent electrically conductive layer at least on one side of the polyimide resin film according to the present invention to provide transparent electrically conductive films, followed by combining the transparent electrically conductive films with an adhesive, sticking agent, or the like.

The transparent electrically conductive layer may be of a generally known material such as metal film and metal oxide film, or a carbon material such as carbon nanotube and graphene, of which metal oxide film is preferred from the viewpoint of transparency, electric conductivity, and mechanical characteristics. Useful material for the metal oxide film include, for example, such metal oxides as indium oxide, cadmium oxide, and tin oxide that contain tin, tellurium, cadmium, molybdenum, tungsten, fluorine, zinc, germanium, or the like as impurity, and zinc oxide and titanium oxide that contain aluminum as impurity. In particular, thin film of indium oxide containing 2 to 15 mass % of tin oxide or zinc oxide has been preferred from the viewpoint of high transparency and high electric conductivity.

To produce the aforementioned transparent electrically conductive layer, any film production method may be adopted as long as it serves to produce an intended thin film, and suitable methods include, for example, a vapor phase deposition technique, in which gas-phase material is deposited to form a film, such as sputtering, vacuum deposition, ion plating, and plasma CVD. In particular, sputtering is preferred for the film production because it can ensure very high electric conductivity and transparency. The transparent electrically conductive layer preferably has a film thickness of 20 to 500 nm, more preferably 50 to 300 nm.

<Circuit Board>

A flexible substrate that adopts the polyimide resin film according to the present invention can serve as substrate for a circuit board. There are no specific limitations on the circuit board and it may adopt the polyimide resin film according to the present invention as base film having some circuit formed thereon. For example, the polyimide resin film according to the present invention is used as base film and a copper foil is attached to one side or both sides thereof with an adhesive layer in between to provide a copper-coated polyimide film (CCL), which is then subjected to photoresist film formation, exposure/development, etching, resist removal, solder resist film formation, electrolytic gold plating, and attaching a cover lay film on top of it to work as a protective layer, thereby providing a circuit board. As described above, the polyimide resin film according to the present invention is so high in transparency that it serves to produce a transparent circuit board. This can be used favorably for producing transparent displays.

<Display Elements and Light-Receiving Elements>

A flexible substrate that adopts the polyimide resin according to the present invention can be used to produce a display element such as liquid crystal display, organic EL display, or electronic paper, or a light-receiving element such as solar battery and CMOS. In particular, the flexible substrate according to the present invention is used suitably when such a display element or light-receiving element is used in a bendable, flexible element.

A typical production process for producing such a display element or light-receiving element is to form a polyimide resin film on a substrate, form a circuit and a function layer necessary for the display elements or light-receiving element, and remove the polyimide resin film from the substrate using a generally known method such as laser irradiation.

Figure 2:
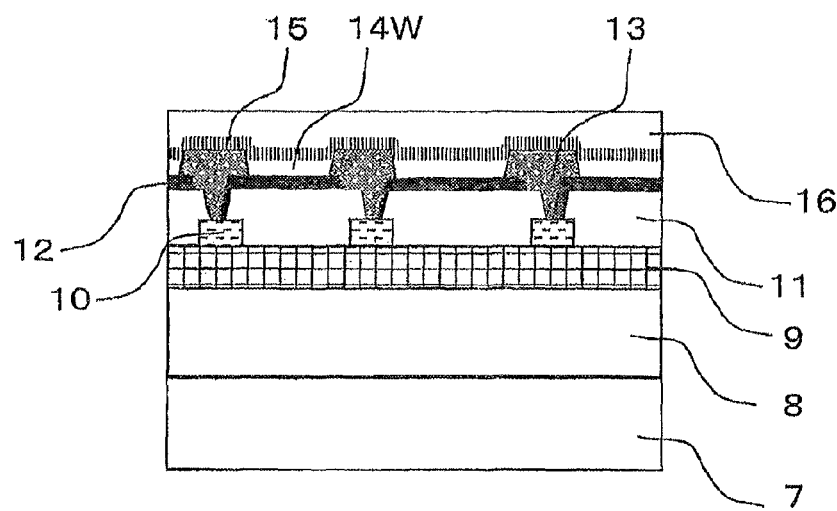
FIG. 2 A cross-sectional view showing a typical organic EL emission element.

For an organic EL emission element as an example of display element, FIG. 2 illustrates a typical organic EL emission element (top emission type white light emitting organic EL). A polyimide resin film 8 is located on a support substrate 7, with a gas barrier layer 9, which is an inorganic film, disposed on it, and a TFT circuit, organic EL layer, etc., disposed on top of it. The TFT circuit, organic EL layer, etc., have TFTs 10 containing amorphous silicon, low temperature polysilicon, oxide semiconductor, and the like, a planarizing layer 11, a first electrode 12 that is made of Al and ITO and the like, a white organic EL layer 14W that contains an insulation film 13 covering the edge of the first electrode 12 as well as a hole injection layer, hole transport layer, luminescent layer, electron transport layer, and electron injection layer, a second electrode 15 that is made of ITO and the like, and a gas barrier layer 16 to seal the structure. This structure is used as an organic EL emission element after removing the polyimide resin film 8 from the support substrate 7 by a generally known method such as laser irradiation.

An organic EL emission element including the polyimide resin film according to the present invention can be produced at least by the following steps.

(1) A step for coating a support substrate with a polyimide precursor resin composition that contains a polyimide precursor and a solvent.
(2) A step for removing the solvent from the coating of the polyimide precursor resin composition.
(3) A step for imidizing the polyimide precursor to form a polyimide resin film.
(4) A step for forming a TFT circuit and an organic EL layer on top of the polyimide resin film.
(5) A step for removing the polyimide resin film from the support substrate.

The steps from (1) to (3) are as described in detail in section <Polyimide resin film>.

Step (4) described above is designed to produce TFTs 10 that contains amorphous silicon, low temperature polysilicon, oxide semiconductor, and the like, a planarizing layer 11, a first electrode 12 that contains Al, ITO, and the like, a white or colored (red, green, blue, or the like) organic EL layer that has an insulation film 13 covering the edge of the first electrode 12 and contains a hole injection layer, hole transport layer, luminescent layer, electron transport layer, and electron injection layer, and a second electrode 15 that contains ITO and the like, which are produced in this order. In this process, it is preferable to first produce a gas barrier layer 9, which is an inorganic film, on the polyimide resin film 8 and subsequently produce a TFT circuit and organic EL layer and it is also preferable to produce a gas barrier layer 16 for sealing, after the formation of the organic EL layer.

Step (5) is the same as that described previously.

Here, the light extraction method to be adopted may be either a bottom emission type one in which light is extracted to the TFT substrate side or a top emission type one in which light is extracted to the sealing substrate side. As described above, the use of the polyimide resin film according to the present invention enables the production of a TFT with high accuracy and reduction in the color drift that can occur when looked in an oblique direction. Furthermore, a gas barrier layer can be formed at a high temperature on the polyimide resin film according to the present invention, enabling the reduction in the panel's gas transmittance. Thus, the use of an organic EL emission element that contains the polyimide resin film according to the present invention serves to produce a flexible organic EL display that suffers from few defects such as dark spots and little change in chromaticity and has high display quality and display reliability.

<Organic EL Display>

An organic EL emission element containing the polyimide resin film according to the present invention and/or a CF containing the polyimide resin film according to the present invention can be used suitably in the form of an organic EL display equipped therewith.

Figure 7:
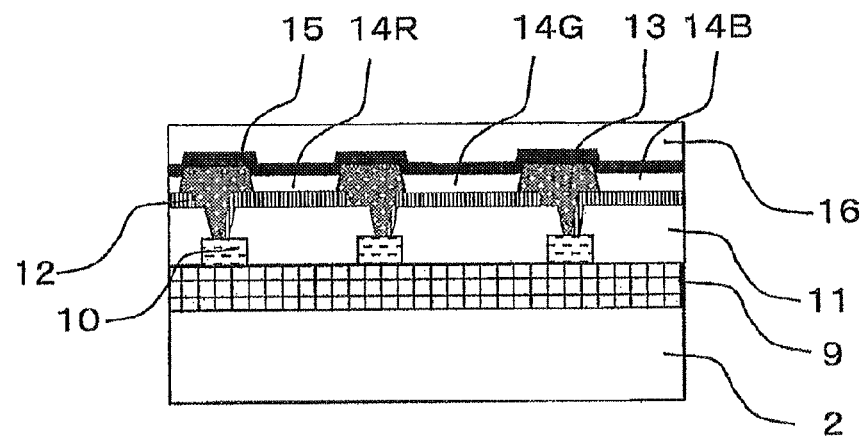
FIG. 7 A cross-sectional view showing a typical organic EL display.

A. An Organic EL Display Equipped with an Organic EL Emission Element Containing the Polyimide Resin Film According to the Present Invention In section <Display element and light-receiving element> described above, the use of an organic EL emission element containing the polyimide resin film according to the present invention enables the production of an organic EL display. For example, the polyimide resin film according to the present invention is so high in transparency that an organic EL display (bottom emission type) as shown in FIG. 7 can be obtained by producing a gas barrier film, TFT circuit, and organic EL layer (red/green/blue) on the polyimide resin film according to the present invention.

B. An Organic EL Display Equipped with a CF Containing the Polyimide Resin Film According to the Present Invention A full-color organic EL display can be obtained by combining a CF containing the polyimide resin film according to the present invention with an organic EL emission element. In particular, it is preferable to combine a white light emitting organic EL emission element that use polyimide resin film as base material with the CF according to the present invention. Here, the polyimide resin film to be used as base material of the organic EL emission element may be either an existing type polyimide resin film or the polyimide resin film according to the present invention.

Figure 3:
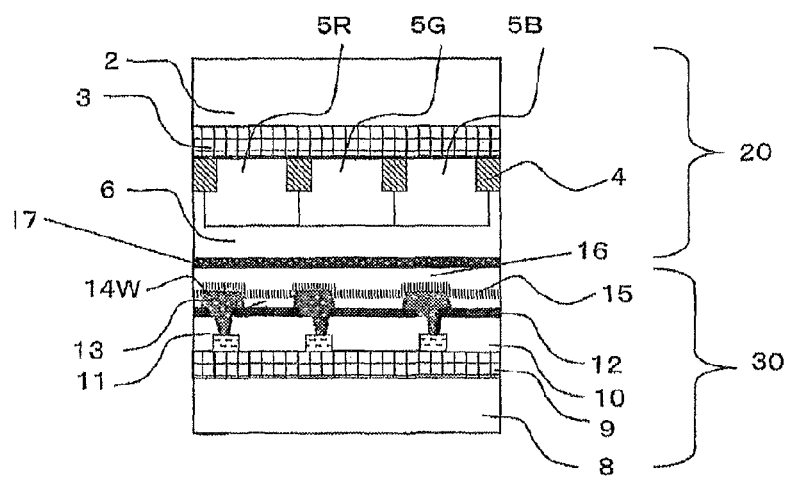
FIG. 3 A cross-sectional view showing a typical organic EL display.

FIG. 3 shows a typical organic EL display produced by pasting the CF according to the present invention to a white light emitting type organic EL emission element. A typical production process is described below. The CF 20 according to the present invention is formed on a first support substrate (not shown in the figure) by the production method described above. Elsewhere, an organic EL emission element 30 containing a polyimide resin film as substrate is produced on a second support substrate (not shown in the figure) by the method described above. Subsequently, the CF 20 and the organic EL emission element 30 are pasted together with a sticking layer 17 therebetween. The first and second support substrates are removed by applying a laser beam to the first and second support substrates through the respective support substrates.

There are no specific limitations on the sticking layer, and for example, it may be a sticking agent, pressure-sensitive adhesive, or adhesive cured by light, heat, or the like. There are no specific limitations on the resin of the sticking layer and useful resins include, for example, acrylic resin, epoxy resin, urethane resin, polyamide resin, polyimide resin, and silicone resin.

There are no specific limitations on the polyimide resin film formed on the second substrate, and it may be the polyimide resin film according to the present invention or a generally known type polyimide resin film. Such generally known polyimides include, for example, wholly aromatic polyimides that contain an acid component such as pyromellitic dianhydride and 3,3',4,4'-biphenyl tetracarboxylic dianhydride and a diamine component such as paraphenylene diamine, 4,4'-diaminodiphenyl ether, 2,2'-dimethyl benzidine, 2,2'-ditrifluoromethyl-4,4'-diaminobiphenyl.

There are no specific limitations on the type of laser used to remove the first and second support substrates as long as their removal can be performed appropriately, and it may be, for example, excimer laser (wavelength 248, 308, 351 nm), YAG laser (wavelength 1064, 532, 355 nm), He-NE laser (633 nm), carbon dioxide gas laser (wavelength 1060 nm), or the like.

EXAMPLES

The present invention will be illustrated below in greater detail with reference to Examples, but it should be understood that the invention is not construed as being limited thereto.

(1) Polyimide Resin Film Production 1

A 6 inch mirror silicon wafer was spin-coated with a polyimide precursor resin composition in a varnish state by an application/development apparatus (Mark-7, manufactured by Tokyo Electron Ltd.) in such a manner that the film thickness would be 15±0.5 µm after 4-minute prebaking at 140° C. Subsequently, the hot plate of Mark-7, that is, the same apparatus as above, was used to perform prebaking treatment at 140° C. for 4 minutes (mainly for removing the solvent from coating of the polyimide precursor resin composition). The prebaked film was heated in a nitrogen flow (oxygen concentration 20 ppm or less) up to 300° C. at a rate of 3.5° C./min using an inert gas oven (INH-21CD, manufactured by Koyo Thermo Systems Co., Ltd.), maintained there for 30 minutes to imidize the polyimide precursor, and cooled down to 50° C. at a rate of 5° C./min to produce a polyimide resin film. Subsequently, the polyimide resin film was removed from the substrate by immersion in hydrofluoric acid for 1-4 minutes and then it was air-dried to provide a polyimide resin film.

(2) Polyimide Resin Film Production 2

Except that a ¼ portion of a 6 inch silicon substrate was cut out and spin-coated with a polyimide precursor in such a manner that the film thickness would be 30±1.0 µm after 4-minute prebaking at 140° C., the same procedure as for Polyimide resin film production 1 was carried out to provide a polyimide resin film.

(3) Polyimide Resin Film Production (on Glass Substrate) 1

A glass substrate with a size of 50 mm×50 mm×0.7 mm thickness (AN-100, manufactured by Asahi Glass Co., Ltd.) was spin-coated with varnish using a spin coater (MS-A200, manufactured by Mikasa Co., Ltd.) in such a manner that the film thickness would be 15±0.5 µm after 4-minute prebaking at 140° C. Then, prebaking treatment was carried out at 140° C. for 4 minutes using a hot plate (D-SPIN, manufactured by Dainippon Screen Mfg. Co., Ltd.). The prebaked film was heated in a nitrogen flow (oxygen concentration 20 ppm or less) up to 300° C. at a rate of 3.5° C./min using an inert gas oven (INH-21CD, manufactured by Koyo Thermo Systems Co., Ltd.), maintained there for 30 minutes, and cooled down to 50° C. at a rate of 5° C./min to produce a polyimide resin film (on a glass substrate).

(4) Polyimide Resin Film Production (on Glass Substrate) 2

A glass substrate with a size of 300 mm×350 mm×0.7 mm thickness (AN-100, manufactured by Asahi Glass Co., Ltd.) was spin-coated with varnish using a slit coater (manufactured by Toray Engineering Co., Ltd.) in such a manner that the film thickness would be 15±0.5 µm after 4-minute prebaking at 140° C. Then, prebaking treatment was carried out at 140° C. for 4 minutes using a hot plate. The prebaked film was heated in a nitrogen flow (oxygen concentration 20 ppm or less) at such a heating rate that 300° C. was reached in 70 minutes using an inert gas oven (INH-21CD, manufactured by Koyo Thermo Systems Co., Ltd.), maintained there for 30 minutes, and cooled down to 50° C. at a rate of 5° C./min to produce a polyimide resin film (on a glass substrate).

(5) Measurement of Light Transmittance (T)

The light transmittance at 400 nm was measured using an ultraviolet-visible spectrophotometer (MultiSpec1500, manufactured by Shimadzu Corporation). Here, the polyimide resin film formed on a glass substrate in section (3) was used for the measurement.

(6) Measurement of Refractive Index and Birefringence

The TE refractive index (n(TE)) and TM refractive index (n(TM)) at a wavelength of 632.8 nm were measured using a prism coupler (PC2010, manufactured by Metricon). The n(TE) and n(TM) are refractive index in the parallel and the perpendicular direction, respectively, to the surface of the polyimide film. The average refractive index n(AV) was calculated as $((2 \times n(TE)^2 + n(TM)^2)/3)^{0.5}$ and the birefringence was calculated as the difference between the n(TE) and the n(TM), namely, (n(TE)−n(TM)). Here, the polyimide resin film formed in section (2) was used for the measurement.

(7) Measurement of CTE

Measurements were made in a nitrogen flow using a thermomechanical analysis apparatus (EXSTAR6000 TMA/SS6000, manufactured by SII NanoTechnology Inc.) Heating was performed under the following conditions. A specimen was heated up to 200° C. at a heating rate of 5° C./min in the first stage to remove adsorbed water and cooled to room temperature at a cooling rate of 5° C./min in the second stage. In the third stage, measurements were made at a heating rate of 5° C./min to determine the CTE averaged over the range from 50° C. to 200° C. Here, the polyimide resin film formed in section (1) was used for the measurement.

(8) Evaluation in Cracking

A prebaked film was prepared as described in section (3) and 100 fields were observed visually under an optical microscope (OPTIPHOT300, manufactured by Nikon) while recording the number of fields that contained cracking.

(9) Measurement of Warp in Substrate

For warp measurement, a specimen was put on a precision stone surface plate (1,000 mm×1,000 mm) manufactured by Mitutoyo Corporation and the lift (distance) of the square specimen above the plate was measured at a total of eight positions, namely, the middle point of each side and the apex of each corner of the specimen, using a clearance gauge. The average of the measurements was taken as the warp. Measurements were taken at room temperature.

(10) Measurement of Position Accuracy of Black Matrix (BM Position Accuracy)

A polyimide resin film on a glass substrate prepared by the method described in section (3) was spin-coated with a black paste as prepared in Preparation example 3 given below and dried on a hot plate at 130° C. for 10 minutes to produce a black resin coat film. A positive photoresist (SRC-100, manufactured by Shipley) was applied by the spin coating technique and prebaked on a hot plate at 120° C. for 5 minutes. Then, ultraviolet rays were applied through a mask from an ultra-high pressure mercury lamp at 100 mJ/cm$^2$ and the development of the photoresist and the etching of the resin coat film were carried out simultaneously with a 2.38% aqueous solution of tetramethylammonium hydroxide to form a pattern. Furthermore, the resist was removed with methyl cellosolve acetate, followed by heating on a hot plate at 280° C. for 10 minutes for imidization to produce a black matrix. The thickness of the black matrix was measured and found to be 1.4 μm. For each of the glass-based color filter substrates prepared, the shift from the ideal lattice in the black matrix was measured at 24 points in the color filter using SMIC-800 (manufactured by Sokkia Topcon Co., Ltd.). The measurements of the absolute values of the shift were averaged and the value thus obtained was adopted as the shift from the ideal lattice of the black matrix at the relevant level.

(11) Measurement of Angle Dependence of Chromatic Coordinates (x,y) of EL Emission Element The surface of a polyimide resin film on a glass substrate prepared by the method described in section (4) was subjected to sputtering from an ITO target (manufactured by Toto Ltd.) to form an ITO film with a film thickness of 160 nm. Then, the ITO film thus formed was annealed by heating the ITO film in an Ar atmosphere at 200° C. for 1 hour, followed by etching to form an anode on the polyimide substrate. The resulting substrate was subjected to ultrasonic cleaning for 15 minutes with Semico Clean 56 (trade name, manufactured by Furuuchi Chemical Corporation) and then washed with ultrapure water. Immediately before element production, this substrate was subjected to UV ozone treatment for 1 hour and placed in vacuum evaporation equipment, which was then exhausted to a vacuum of not more than 5×10$^{-4}$ Pa. Resistance heating was then performed to form a hole transport layer, organic luminescent layer, and electron transport layer in this order to produce a red organic EL layer. Subsequently, a cathode made of Mg and ITO was formed over the entire surface above the substrate. In addition, a SiON sealing film was formed by the CVD film production technique. The resulting substrate was taken out of the deposition apparatus and an excimer laser (wavelength 308 nm) was applied through the glass substrate to remove the organic EL emission element from the glass substrate. The resulting organic EL emission element was driven at a constant voltage of 6 V and the chromatic coordinates (x,y) were measured in the 0° and 70° directions using a brightness orientation characteristics measuring apparatus (C9920-11, manufactured by Hamamatsu Photonics K.K.) A smaller difference between measurements (x,y) determined in the two directions means a smaller color drift in the oblique fields of view.

Listed below are abbreviations of the compounds used in Examples.

BPDA: 3,3',4,4'-biphenyl tetracarboxylic dianhydride
ODPA: 3,3',4,4'-oxydiphthalic dianhydride
6FDA: 4,4'-(hexafluoroisopropylidene)diphthalic anhydride
BSAA: 2,2-bis(4-(3,4-dicarboxyphenoxy)phenyl)propane dianhydride
PMDA-HS: 1R,2S,4S,5R-cyclohexanetetracarboxylic dianhydride
BPAF: 4,4'-(fluorenyl)diphthalic anhydride
BPF-EPA: 4,4'-((9H-fluorenyl)bis(4,1-phenyleneoxycarbonyl))diphthalic dianhydride
BPF-PA: 9,9-bis(4-(3,4-dicarboxyphenoxy)phenyl)fluorene anhydride
CHDA: trans-1,4-diaminocyclohexane
TFMB: 2,2'-bis(trifluoromethyl)benzidine
FDA: 9,9-bis(4-aminophenyl)fluorene
FDH: 9,9-bis(3-(3-aminobenzamido)-4-hydroxyphenyl) fluorene
BPF-AN: 9,9-bis(4-(4-aminophenoxy)phenyl) fluorene
NMP: N-methyl-2-pyrolidone Preparation Example 1: Preparation of Polyimide Precursor Composition (Varnish)

In a dried nitrogen flow, 129.0416 g (0.438 mol) of BPDA, 47.4290 g (0.438 mol) of PDA, and 1,000 g of NMP were put in a 2,000 mL four-necked flask and heated while stirring at 65° C. After 6 hours, the liquid was cooled to provide a polyamic acid resin solution (resin concentration 15 wt %).

Preparation Example 2: Preparation of Polyimide Precursor Composition (Varnish)

Here, 60.07 g (0.30 mol) of DAE, 70.29 g (0.65 mol) of PDA, and 12.43 g (0.05 mol) of SiDA were mixed with 850 g of GBL and 850 g of NMP and then 309.43 g (0.9975 mol) of ODPA was added, followed by maintaining the reaction at 80° C. for 3 hours. Then, 1.96 g (0.02 mol) of maleic anhydride was added and the reaction was maintained at 80° C. for additional 1 hour to provide a polyamic acid resin solution (resin concentration 20 wt %).

Preparation Example 3: Production of a Black Light-Blocking Agent Composition for Black Matrix Formation To 250 g of the polyimide precursor composition (varnish) prepared in Preparation example 2, 50 g of carbon black (MA100, manufactured by Mitsubishi Chemical Corporation) and 200 g of NMP were added and dispersed with zirconia beads with a diameter of 0.3 mm at 3,200 rpm for 3 hours in a Dyno-Mill KDL-A to provide a light-blocking agent dispersion liquid 1.

Then, 49.9 g of NMP and 0.1 g of a surface active agent (LC951, manufactured by Kusumoto Chemicals, Ltd.) were added to 50 g of this light-blocking agent dispersion liquid 1 to provide a nonphotosensitive light-blocking agent composition.

Preparation Example 4: Production of a Photosensitive Red Coloring Agent Composition for Red Colored Pixel Formation As coloring agents, 50 g of PR177 (Chromofine (registered trademark) Red 6125EC, manufactured by Dainichiseika Color & Chemicals Mfg. Co., Ltd.) and 50 g of PR254 (Irgaphor (registered trademark) Red BK-CF, manufactured by Ciba Specialty Chemicals) were added. This coloring agent mixture was mixed with 100 g of a polymer dispersing agent (BYK2000, resin concentration 40 wt %, manufactured by BYK Japan KK), 67 g of an alkali soluble resin (Cyclomer (registered trademark) ACA250, resin concentration 45 wt %, manufactured by Daicel Chemical Industries, Ltd.), 83 g of propylene glycol monomethyl ether, and 650 g of propylene glycol monomethyl ether acetate to provide slurry. This slurry was put in a beaker and it was connected to a circulation type bead mill/disperser (Dyno-Mill KDL-A, manufactured by Willy A. Bachofen) via a tube, followed by dispersion treatment at 3,200 rpm for 4 hours using, as medium, zirconia beads with a diameter of 0.3 mm to provide a coloring agent dispersion liquid.

To 45.7 g of this coloring agent dispersion liquid, 7.8 g of Cyclomer ACA250, 3.3 g of a photopolymerizable monomer (Kayarad (registered trademark) DPHA, manufactured by Nippon Kayaku Co., Ltd., 0.2 g of a photopolymerization initiator (Irgacure (registered trademark) 907, manufactured by Ciba Specialty Chemicals), 0.1 g of a photopolymerization initiator (Kayacure (registered trademark) DETX-S, manufactured by Nippon Kayaku Co., Ltd.), 0.03 g of a surface active agent (BYK333, manufactured by BYK Japan KK.), and 42.9 g of propylene glycol monomethyl ether acetate were added to provide a coloring agent composition. In the coloring agent composition, the coloring agents accounted for 31 wt % of the total solid content and the mixing ratio by weight between the coloring agents was PR177:PR254=50:50.

Preparation Example 5: Production of a Photosensitive Green Coloring Agent Composition for Green Colored Pixel Formation As coloring agents, 65 g of PG7 (Hostaperm (registered trademark) Green GNX; manufactured by Clariant Japan K.K.) and 35 g of PY150 (E4GNGT, manufactured by Lanxess K.K.) were added. To this coloring agent, 100 g of BYK2000, 67 g of Cyclomer ACA250, 83 g of propylene glycol monomethyl ether, and 650 g of propylene glycol monomethyl ether acetate were added, and dispersed with zirconia beads with a diameter of 0.3 mm at 3,200 rpm for 6 hours in a Dyno-Mill KDL-A to provide a coloring agent dispersion liquid.

To 51.7 g of this coloring agent dispersion liquid, 6.3 g of Cyclomer ACA250, 2.9 g of Kayarad DPHA, 0.2 g of Irgacure 907, 0.1 g of Kayacure DETX-S, 0.03 g of BYK333, and 38.8 g of propylene glycol monomethyl ether acetate were added to provide a coloring agent composition. In the coloring agent composition, the coloring agents accounted for 35 wt % of the total solid content and the weight ratio between the coloring agents was PG7:PY150=65:35.

Preparation Example 6: Production of a Photosensitive Blue Coloring Agent Composition for Blue Colored Pixel Formation As coloring agent, 100 g of PB15:6 (Lionol (registered trademark) Blue 7602, manufactured by Toyo Ink Co., Ltd.) was used and this coloring agent was mixed with 100 g of BYK2000, 67 g of Cyclomer ACA250, 83 g of propylene glycol monomethyl ether, and 650 g of propylene glycol monomethyl ether acetate to provide slurry. In a Dyno-Mill KDL-A disperser, this slurry was subjected to dispersion treatment at 3,200 rpm for 3 hours using zirconia beads with a diameter of 0.3 mm to provide a coloring agent dispersion liquid.

To 41.3 g of this coloring agent dispersion liquid, 8.9 g of Cyclomer ACA250, 3.5 g of Kayarad DPHA, 0.2 g of Irgacure 907, 0.1 g of Kayacure DETX-S, 0.03 g of BYK333, and 46 g of propylene glycol monomethyl ether acetate were added to provide a coloring agent composition. In the coloring agent composition, the coloring agent accounted for 28 wt % of the total solid content and PB15:6 was the only coloring agent used.

Preparation Example 7: Production of a Nonphotosensitive Red Coloring Agent Composition for Red Colored Pixel Formation First, 3.6 g (80 wt %) of Pigment Red PR254, 0.9 g (20 wt %) of Pigment Red PR177, 22.5 g of a polymer dispersing agent (PD), and 63 g of NMP were mixed to prepare slurry. In a Dyno-Mill KDL-A disperser, this slurry was subjected to dispersion treatment at 3,200 rpm for 3 hours using zirconia beads with a diameter of 0.3 mm to provide a coloring agent dispersion liquid.

Then, 45.6 g of this coloring agent dispersion liquid was mixed with 18.2 g of the polyimide precursor varnish prepared in Preparation example 2, 0.1 g of 3-aminopropyl triethoxysilane, adopted as contact improving agent, 0.03 g of an acrylic based surface active agent, adopted as surface active agent, and an appropriate quantity of NMP to provide a red color paste (PR-1) having a pigment/resin ratio of 25/75 (wt/wt), solid content of 6%, and solvent, i.e. NMP, content of 94 wt %.

Preparation Example 8: Production of a Nonphotosensitive Green Coloring Agent Composition for Green Colored Pixel Formation First, 2.7 g (60 wt %) of Pigment Green PG36, 1.8 g (40 wt %) of Pigment Yellow PY150, 22.5 g of a polymer dispersing agent (PD), and 63 g of NMP were mixed to prepare slurry. In a Dyno-Mill KDL-A disperser, this slurry was subjected to dispersion treatment at 3,200 rpm for 3 hours using zirconia beads with a diameter of 0.3 mm to provide a coloring agent dispersion liquid.

Then, 45.6 g of this coloring agent dispersion liquid was mixed with 18.2 g of the polyimide precursor varnish prepared in Preparation example 2, 0.1 g of 3-aminopropyl triethoxysilane, adopted as contact improving agent, 0.03 g of an acrylic based surface active agent, adopted as surface active agent, and an appropriate quantity of NMP to provide a green color paste (PG-1) having a pigment/resin ratio of 25/75 (wt/wt), solid content of 6%, and solvent, i.e. NMP, content of 94 wt %.

Preparation Example 9: Production of a Nonphotosensitive Blue Coloring Agent Composition for Blue Colored Pixel Formation First, 4.5 g of Pigment Blue PB15:6 was mixed with 22.5 g of a polymer dispersing agent (PD), and 63 g N-methyl pyrolidone to prepare slurry. In a Dyno-Mill KDL-A disperser, this slurry was subjected to dispersion treatment at 3,200 rpm for 3 hours using zirconia beads with a diameter of 0.3 mm to provide a coloring agent dispersion liquid.

Then, 45.6 g of this coloring agent dispersion liquid was mixed with 18.2 g of the polyimide precursor varnish prepared in Preparation example 2, 0.1 g of 3-aminopropyl triethoxysilane, adopted as contact improving agent, 0.03 g of an acrylic based surface active agent, adopted as surface active agent, and an appropriate quantity of NMP to provide a blue color paste (PB-1) having a pigment/resin ratio of 25/75 (wt/wt), solid content of 6 wt %, and solvent, i.e. NMP, content of 94 wt %.

Preparation Example 10: Production of a Resin Composition for Transparent Protective Film Formation To 65.05 g of trimellitic acid, 280 g of GBL and 74.95 g of γ-aminopropyl triethoxysilane were added and heated at 120° C. for 2 hours. To 20 g of the resulting solution, 7 g of bisphenoxy ethanol fluorene diglycidyl ether and 15 g of diethylene glycol dimethyl ether were added to provide a resin composition.

Preparation Example 11: Synthesis of Polysiloxane Solution

In a 500 ml three-necked flask, 81.72 g (0.60 mol) of methyl trimethoxysilane, 59.49 g (0.30 mol) of phenyl trimethoxysilane, 24.64 g (0.10 mol) of 2-(3,4-epoxycyclohexyl) ethyl trimethoxysilane, and 163.1 g of diacetone alcohol were fed and an aqueous phosphoric acid solution prepared by dissolving 0.54 g (accounting for 0.3 wt % relative to the monomers fed) of phosphoric acid in 55.8 g of water was added gradually for 10 minutes while stirring at room temperature. Subsequently, the flask was immersed in an oil bath at 40° C., followed by stirring for 30 minutes and then heating the oil bath for 30 minutes up to 115° C. One hour after the start of heating, the internal temperature in the solution reached 100° C. and heating was continued further while stirring for additional 1.5 hours (the internal temperature maintained at 100° C. to 110° C.). Nitrogen was supplied at a rate of 0.05 L (liters) per minute during the heating/stirring period. A total of 131 g of methanol and water was distilled out as by-products from the reaction.

In the resulting polysiloxane solution, the solid content was 43 wt % and the polysiloxane had a weight average molecular weight of 4,200. The phenyl-substituted silane in the polysiloxane accounted for 30 mol % in terms of the Si atom mole ratio.

Preparation Example 12: Production of Photosensitive Positive Type Transparent Resist A photosensitive positive type transparent resist was prepared by mixing, while stirring in a yellow light, 15.43 g of the polysiloxane solution produced by the above synthesis procedure, 0.59 g of a quinone diazide compound, 3.73 g of diacetone alcohol adopted as solvent, and 9.84 g of propylene glycol monomethyl ether acetate to provide a uniform solution, followed by filtration through a 0.45 μm filter.

Example 1

In a dried nitrogen flow, 3.1495 g (27.51 mmol) of CHDA, 1.0651 g (3.06 mmol) of FDA, 7.1951 g (24.45 mmol) of BPDA, 2.7159 g (6.11 mmol) of 6FDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/6FDA/CHDA/FDA, was 80/20/90/10. A polyimide resin film was prepared from the resulting polyimide precursor by the methods described in sections (1) to (4) and its light transmittance, birefringence, CTE, cracking, substrate warp, BM position accuracy, and angle dependence of chromatic coordinates in an EL emission element were measured by the techniques described in sections (5) to (11). Results are given in Table 1.

Example 2

In a dried nitrogen flow, 3.4068 g (29.83 mmol) of CHDA, 0.5471 g (1.57 mmol) of FDA, 8.0387 g (27.32 mmol) of BPDA, 2.1250 g (4.08 mmol) of BSAA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/BSAA/CHDA/FDA, was 87/13/95/5. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 3

In a dried nitrogen flow, 3.4463 g (30.18 mmol) of CHDA, 0.9145 g (2.62 mmol) of FDA, 7.7216 g (26.24 mmol) of BPDA, 2.0353 g (6.56 mmol) of ODPA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/ODPA/CHDA/FDA, was 80/20/92/8. As in Example 1, a cured film was prepared and its transmittance, birefringence, and linear expansion coefficient were measured Results are given in Table 1. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 4

In a dried nitrogen flow, 3.7100 g (32.49 mmol) of CHDA, 0.7226 g (2.62 mmol) of FDA, 8.1354 g (27.65 mmol) of BPDA, 1.5496 g (6.91 mmol) of PMDA-HS, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/PMDA-HS/CHDA/FDA, was 80/20/94/6. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 5

In a dried nitrogen flow, 3.5082 g (30.72 mmol) of CHDA, 0.5634 g (1.62 mmol) of FDA, 8.5635 g (29.11 mmol) of BPDA, 1.4825 g (3.23 mmol) of BPAF, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/BPAF/CHDA/FDA, was 90/10/95/5. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 6

In a dried nitrogen flow, 3.3253 g (29.12 mmol) of CHDA, 0.5340 g (1.53 mmol) of FDA, 8.1168 g (27.59 mmol) of BPDA, 2.1415 g (3.07 mmol) of BPF-EPA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/BPF-EPA/CHDA/FDA, was 90/10/95/5. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 7

In a dried nitrogen flow, 3.3662 g (29.48 mmol) of CHDA, 0.5406 g (1.55 mmol) of FDA, 8.2168 g (27.93 mmol) of BPDA, 1.9940 g (3.10 mmol) of BPF-PA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/BPF-PA/CHDA/FDA, was 90/10/95/5. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 8

In a dried nitrogen flow, 3.3209 g (29.08 mmol) of CHDA, 0.5333 g (1.53 mmol) of FDA, 6.7551 g (22.96 mmol) of BPDA, 3.5083 g (7.65 mmol) of BPAF, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/BPAF/CHDA/FDA, was 75/25/95/5. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 9

In a dried nitrogen flow, 3.1226 g (27.35 mmol) of CHDA, 1.1439 g (3.04 mmol) of MFDA, 7.1516 g (24.31 mmol) of BPDA, 2.6995 g (6.08 mmol) of 6FDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/6FDA/CHDA/MFDA, was 80/20/90/10. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 10

In a dried nitrogen flow, 3.0978 g (27.13 mmol) of CHDA, 1.4594 g (2.36 mmol) of FHA, 6.9406 g (23.59 mmol) of BPDA, 2.6199 g (5.90 mmol) of 6FDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/6FDA/CHDA/FHA, was 80/20/92/8. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 11

In a dried nitrogen flow, 3.0211 g (26.46 mmol) of CHDA, 1.5657 g (2.94 mmol) of BPF-AN, 6.9191 g (23.52 mmol) of BPDA, 2.6118 g (5.88 mmol) of 6FDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/6FDA/CHDA/BPF-AN, was 80/20/90/10. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 12

In a dried nitrogen flow, 3.3598 g (29.42 mmol) of CHDA, 1.1391 g (3.27 mmol) of FDA, 9.6187 g (32.69 mmol) of BPDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/CHDA/FDA, was 100/90/10. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 13

In a dried nitrogen flow, 3.3381 g (29.23 mmol) of CHDA, 1.2229 g (3.25 mmol) of MFDA, 9.5566 g (32.48 mmol) of BPDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/CHDA/MFDA, was 100/90/10. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 14

In a dried nitrogen flow, 3.1619 g (27.69 mmol) of CHDA, 1.9035 g (3.08 mmol) of FHA, 9.0522 g (30.77 mmol) of BPDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/CHDA/FHA, was 100/92/8. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Example 15

In a dried nitrogen flow, 3.2224 g (28.22 mmol) of CHDA, 1.6701 g (3.14 mmol) of BPF-AN, 9.2252 g (31.35 mmol) of BPDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/CHDA/BPF-AN, was 100/90/10. As in Example 1, a polyimide resin film was prepared and its light transmittance, birefringence, CTE, cracking, substrate warp, BM position accuracy, and angle dependence of chromatic coordinates in an EL emission element were measured. Results are given in Table 1.

Comparative Example 1

In a dried nitrogen flow, 3.9472 g (34.57 mmol) of CHDA, 10.1704 g (34.57 mmol) of BPDA, and 80 g of NMP were put in a 200 mL four-necked flask and heated at 65° C. while stirring. Six hours later, it was cooled to provide a polyimide precursor composition (varnish). As in Example 1, a polyimide resin film was prepared and its light transmittance, birefringence, CTE, substrate warp, BM position accuracy, and angle dependence of chromatic coordinates in an EL emission element were measured. Results are given in Table 1.

Comparative Example 2

In a dried nitrogen flow, 5.9138 g (18.47 mmol) of TFMB, 8.2039 g (18.47 mmol) of 6FDA, and 80 g of NMP were put in a 200 mL four-necked flask and heated at 65° C. while stirring. Six hours later, it was cooled to provide a polyimide precursor composition (varnish). As in Example 1, a polyimide resin film was prepared and its light transmittance, birefringence, CTE, substrate warp, BM position accuracy, and angle dependence of chromatic coordinates in an EL emission element were measured. Results are given in Table 1.

Comparative Example 3

In a dried nitrogen flow, 3.9014 g (34.17 mmol) of CHDA, 7.0366 g (23.92 mmol) of BPDA, 3.1796 (10.25) of ODPA, and 80 g of NMP were put in a 100 mL four-necked flask and heated at 65° C. while stirring. Six hours later, it was cooled to provide a polyimide precursor composition (varnish). In this instance, the molar ratio among the monomers, BPDA/ODPA/CHDA, was 70/30/100. As in Example 1, a polyimide resin film was prepared and its light transmittance, birefringence, CTE, substrate warp, BM position accuracy, and angle dependence of chromatic coordinates in an EL emission element were measured. Results are given in Table 1.

Comparative Example 4

In a dried nitrogen flow, 1.8178 g (15.92 mmol) of CHDA, 3.6978 (10.61 mmol) of FDA, 6.2448 g (21.22 mmol) of BPDA, 2.3572 g (5.31 mmol) of 6FDA, and 80 g of NMP were put in a 200 mL four-necked flask and heated at 65° C. while stirring. Six hours later, it was cooled to provide a polyimide precursor composition (varnish). In this instance, the molar ratio among the monomers, BPDA/6FDA/CHDA/FDA, was 80/20/60/40. As in Example 1, a polyimide resin film was prepared and its light transmittance, birefringence, CTE, substrate warp, BM position accuracy, and angle dependence of chromatic coordinates in an EL emission element were measured. Results are given in Table 1.

Comparative Example 5

In a dried nitrogen flow, 7.6544 g (21.97 mmol) of FDA, 6.4633 g (21.97 mmol) of BPDA, and 80 g of NMP were put in a 200 mL four-necked flask and heated at 65° C. while stirring. Six hours later, it was cooled to provide a polyimide precursor composition (varnish). A polyimide resin film prepared as in Example 1 was found to contain cracks over the entire film surface.

Figure 4:
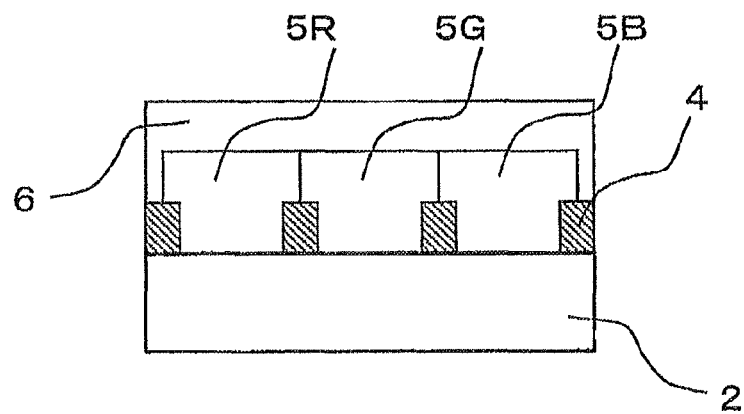
FIG. 4 A cross-sectional view showing a typical color filter.

(Example 16) Preparation of Color Filter (FIG. 4)

(1) Polyimide Resin Film Production

A glass substrate with a size of 300 mm×400 mm×0.7 mm thickness (AN-100, manufactured by Asahi Glass Co., Ltd.) (not shown in the figure) was spin-coated with the varnish synthesized in Example 1 in such a manner that the film thickness would be 15±0.5 μm after 20-minute prebaking at 140° C. Then, prebaking treatment was carried out at 140° C. for 4 minutes using a hot plate. The prebaked film was heated in a nitrogen flow (oxygen concentration 20 ppm or less) up to 300° C. at a rate of 3.5° C./min using an inert gas oven, maintained there for 30 minutes, and cooled down to 50° C. at a rate of 5° C./min to produce a polyimide resin film 2 (on a glass substrate).

[2] Production of Black Matrix

A polyimide resin film on a glass substrate prepared by the method described above was spin-coated with a black paste as prepared in Preparation example 3 and dried on a hot plate at 130° C. for 10 minutes to produce a black resin coat film. A positive photoresist (SRC-100, manufactured by Shipley) was applied by the spin coating technique and prebaked on a hot plate at 120° C. for 5 minutes. Then, ultraviolet rays were applied through a mask from an ultra-high pressure mercury lamp at 100 mJ/cm$^2$ and the development of the photoresist and the etching of the resin coat film were carried out simultaneously with a 2.38% aqueous solution of tetramethylammonium hydroxide to form a pattern. Furthermore, the resist was removed with methyl cellosolve acetate, followed by heating on a hot plate at 280° C. for 10 minutes for imidization to produce a black matrix 4. The thickness of the black matrix was measured and found to be 1.4 μm.

[3] Production of Colored Pixel

On the glass substrate-supported polyimide resin film with a patterned black matrix, the photosensitive red resist prepared in Preparation example 4 was spread in such a manner that the polyimide film was coated while adjusting the spinner's rotating speed so as to allow the thickness in the opening in the black matrix would be 2.0 μm after heat treatment. Then, prebaking was performed on a hot plate at 100° C. for 10 minutes to form a red colored pixel. Subsequently, using an ultraviolet ray exposure machine (PLA-5011, manufactured by Canon Inc.), the opening in the black matrix and a region in the black matrix were exposed to light at 100 mJ/cm$^2$ (intensity of ultraviolet ray at 365 nm) though a chromium photomask that enables island-like light passage. After exposure, development was performed by immersion in a developer, i.e., a 0.2 wt % aqueous solution of tetramethyl ammonium hydroxide, followed by washing in pure water. Subsequently, heat treatment was performed in an oven at 230° C. for 30 minutes to form a red pixel 5R.

The same procedure was repeated to produce a green pixel 5G made of the photosensitive green resist prepared in Preparation example 5 and a blue pixel 5B made of the photosensitive blue resist prepared in Preparation example 6. Then, the resin composition prepared in Preparation example 10 was spread while adjusting the spinner's rotating speed so that the thickness in the colored pixel parts would be 2.5 μm after heat treatment. Subsequently, heat treatment was performed in an oven at 230° C. for 30 minutes to form an overcoat layer 6.

[4] Removal of Color Filter from Glass Substrate

Incisions were made in the periphery of the color filter prepared on a glass substrate by the method described above, followed by immersion in water for 12 hours to remove the color filter from the glass substrate. At this point, the patterned shapes of the pixels were observed by optical microscopy and results showed that no changes in patterned shape occurred in the removal step. It was also found that the resulting color filter had good appearance comparable to that of glass substrate-supported color filters.

(Example 17) Production of Color Filter

Except for producing colored pixels from the nonphotosensitive coloring agent compositions described in Preparation examples 7 to 9 and using the undermentioned methods for colored pixel formation, the same procedure as in Example 16 was carried out to produce a color filter.

On the glass substrate-supported polyimide resin film 2 with a patterned black matrix 4, the nonphotosensitive coloring agent composition prepared in Preparation example 7 was spread in such a manner that the polyimide film was coated while adjusting the spinner's rotating speed so as to allow the thickness in the opening in the black matrix would be 2.0 μm after heat treatment. Then, drying was performed on a hot plate at 130° C. for 10 minutes to form a red resin coat film. On the resin coat film, a positive photoresist (SRC-100, manufactured by Shipley) was spread by the spin coating technique and prebaked on a hot plate at 120° C. for 5 minutes. Then, ultraviolet rays were applied through a mask from an ultra-high pressure mercury lamp at 100 mJ/cm$^2$ and the development of the photoresist and the etching of the resin coat film were carried out simultaneously with a 2.38% aqueous solution of tetramethylammonium hydroxide to form a pattern. The resist was removed with methyl cellosolve acetate, followed by heating on a hot plate at 280° C. for 10 minutes for imidization to produce a red pixel 5R.

The same procedure was repeated to produce a green pixel 5G made of the nonphotosensitive green coloring agent composition prepared in Preparation example 8 and a blue pixel 5B made of the nonphotosensitive blue coloring agent composition prepared in Preparation example 9. Then, the resin composition prepared in Preparation example 10 was spread while adjusting the spinner's rotating speed so that the thickness in the colored pixel parts would be 2.5 μm after heat treatment. Subsequently, heat treatment was performed in an oven at 230° C. for 30 minutes to form an overcoat layer 6.

The patterned shapes of the pixels in the resulting color filter were observed by optical microscopy and results showed that no changes in patterned shape occurred in the removal step. It was also found that the resulting color filter had good appearance comparable to that of glass substrate-supported color filters.

Figure 5:
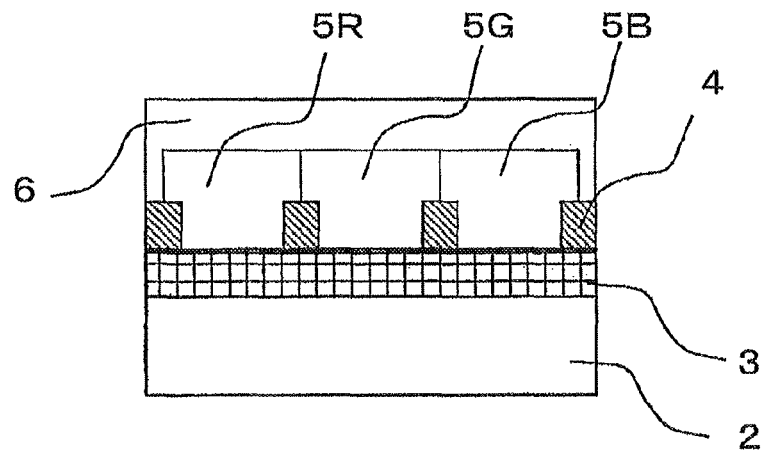
FIG. 5 A cross-sectional view showing a typical color filter.

(Example 18) Production of Color Filter (FIG. 5)

Except for using a silicon oxide target and performing the sputtering technique in an argon atmosphere to form a silicon oxide film as a gas barrier layer 3 with a thickness of 300 nm on a polyimide resin film 2, followed by forming a black matrix 4, colored pixels 5R, 5G, and 5B, and an overcoat layer 6 on the layered film, the same procedure as in Example 17 was carried out to produce a color filter. The gas barrier layer formation was carried out by sputtering under the conditions of a pressure of 2×10$^{-1}$ Pa, substrate temperature of 300° C., and alternating current power supply of 13.56 MHz. The patterned shapes of the pixels were observed by optical microscopy and results showed that no changes in patterned shape occurred in the removal step. It was also found that the resulting color filter had good appearance comparable to that of glass substrate-supported color filters.

Figure 6:
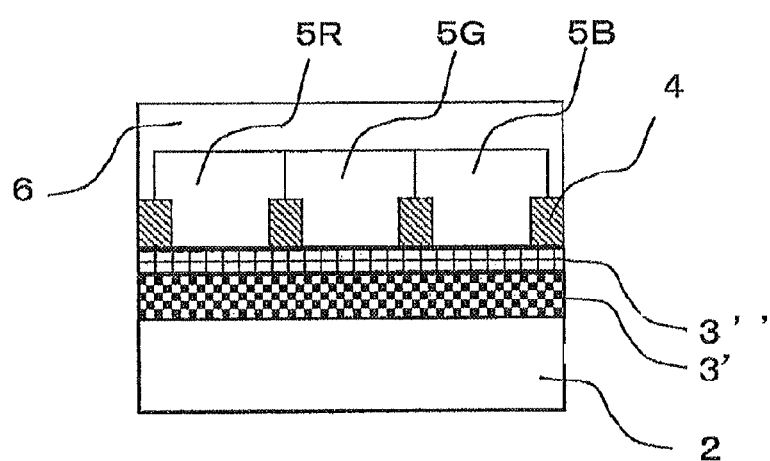
FIG. 6 A cross-sectional view showing a typical color filter.

(Example 19) Production of Color Filter (FIG. 6)

Using a mixed sintered target containing zinc oxide, silicon dioxide, and aluminum oxide at a ratio of 62/35/3 (by mole), sputtering was performed in an argon atmosphere containing 10 vol % of oxygen to form a gas barrier layer (lower layer) 3' with a thickness of 200 nm composed of silicon oxide, zinc oxide, and aluminum oxide on a polyimide resin film 2, followed by sputtering of a silicon oxide target in an argon atmosphere while maintaining a vacuum to form a silicon oxide film as a gas barrier layer (upper layer) 3" with a thickness of 100 nm. On the layered film, a black matrix 4, colored pixels 5R, 5G, and 5B, and an overcoat layer 6 was formed. Except for this, the same procedure as in Example 17 was carried out to produce a color filters. The gas barrier film (lower layer) formation was carried out by sputtering under the conditions of a pressure of 3×10$^{-1}$ Pa, substrate temperature of 300° C., and direct current power supply of 3 kW. The gas barrier film (upper layer) formation was carried out by sputtering under the conditions of a pressure of 2×10$^{-1}$ Pa, substrate temperature of 300° C., and alternating current power supply of 13.56 MHz. The patterned shapes of the pixels were observed by optical microscopy and results showed that no changes in patterned shape occurred in the removal step. It was also found that the resulting color filter had good appearance comparable to that of glass substrate-supported color filters.

(Example 20) Preparation of Active Matrix Type Organic EL Emission Element (FIG. 7)

[1] Production of Polyimide Resin Film

A glass substrate with a size of 300 mm×400 mm×0.7 mm thickness (AN-100, manufactured by Asahi Glass Co., Ltd.) (not shown in the figure) was spin-coated with the varnish prepared in Example 1 in such a manner that the film thickness would be 15±0.5 μm after 10-minute prebaking at 140° C. Then, prebaking treatment was carried out at 140°

C. for 10 minutes using an air blow drier. The prebaked film was heated in a nitrogen flow (oxygen concentration 20 ppm or less) up to 300° C. at a rate of 3.5° C./min using an inert gas oven, maintained there for 30 minutes, and cooled down to 50° C. at a rate of 5° C./min to produce a polyimide resin film 2 (on a glass substrate).

[2] Production of TFT Substrate

A gas barrier layer 9 made of SiO was produced by plasma CVD on top of the polyimide resin film (on a glass substrate) prepared by the method described above. Subsequently, bottom gate type TFTs 10 were formed and an insulation film made of $Si_3N_4$ (not shown in the figure) was formed in such a manner as to cover these TFTs. Then, contact holes were formed in this insulation film and wiring (height 1.0 µm, not shown in the figure) connecting to the TFTs through these contact holes was formed on the insulation film. This wiring was designed for connection among the TFTs and between the TFTs and an organic EL emission element that will be formed in a subsequent step.

In addition, in order to planarize the surface roughened by the wiring formation, a planarizing layer 11 was formed on the insulation film in such manner that the irregularities resulting from the wiring formation were embedded. The formation of the planarizing layer was carried out by spin-coating the substrate with a photosensitive polyimide varnish, prebaking it on a hot plate (at 120° C. for 3 minutes), exposed to light through an appropriately patterned mask, developed, and heat-treated in an air flow at 230° C. for 60 minutes. Coatability was high in the varnish coating step and the planarizing layer resulting from subsequent exposure, development, and heat treatment was free of creasing or cracking. It was found furthermore that the average wiring height was 500 nm and that the resulting planarizing layer contained 5 µm×5 µm square contact holes and had a thickness of about 2 µm.

[3] Production of Bottom Emission Type Organic EL Emission Element

The members described below were formed on the resulting planarizing layer 11 to produce a bottom emission type organic EL emission element. First, the first electrode 12 made of ITO, which was connected to the wiring (not shown in the figure) through the contact holes, was formed on the planarizing layer. Then, the surface was coated with a resist, prebaked, exposed to light through an appropriately patterned mask, and developed. Using this resist pattern as mask, the first electrode was patterned by wet etching with an ITO etchant. Subsequently, the resist pattern was removed using a resist stripping liquid (a liquid mixture of monoethanol amine and diethylene glycol monobutyl ether). After the removal operation, the substrate was rinsed and heated at 200° C. for 30 minutes for dehydration to provide an electrode substrate provided with a planarizing layer. The change in the thickness of the planarizing layer, measured before the stripping liquid treatment and after thermal dehydration, was less than 1%. The first electrode thus obtained corresponds to the anode of an organic EL emission element.

Next, the insulation layer 13 was formed in a shape that covers the edge of the first electrode. The insulation layer was formed of the same photosensitive polyimide varnish as above. The provision of this insulation layer serves to prevent short-circuiting between the first electrode and the second electrode 15 that will be formed in a subsequently step.

In addition, a red organic EL layer 14R, green organic EL layer 14G, and blue organic EL layer 14B were formed by depositing a hole transport layer, organic luminescent layer, and electron transport layer in this order through appropriate pattern masks in a vacuum deposition apparatus. Subsequently, the second electrode 15 made of Al and Mg (Al: reflecting electrode) was formed over the entire surface above the substrate. In addition, a SiON sealing film 16 was formed by the CVD film production technique. The resulting substrate was taken out of the deposition apparatus and an excimer laser (wavelength 308 nm) was applied through the glass substrate to remove the organic EL emission element from the glass substrate. The resulting active matrix type organic EL emission element showed good luminescent performance when a voltage was applied through a drive circuit. It was also found that the performance of the resulting organic EL emission element was as good as that of organic EL emission elements produced on glass substrates.

Figure 8:
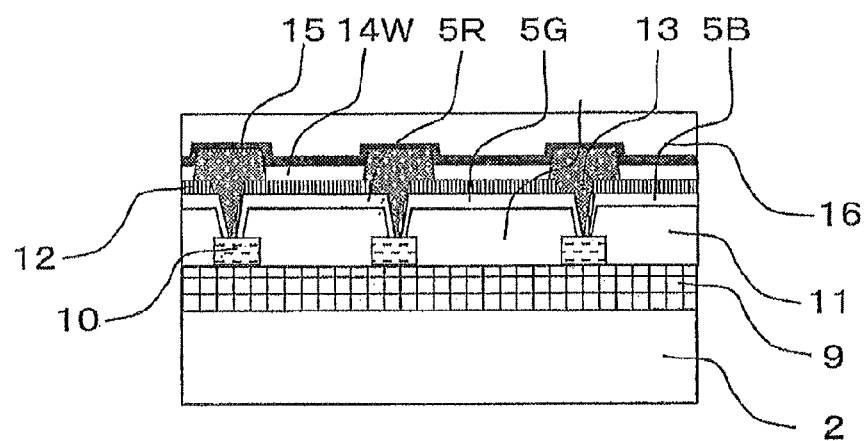
FIG. 8 A cross-sectional view showing a typical organic EL display.

(Example 21) Production of Organic EL Display (Active Matrix Type) (FIG. 8)

[1] Production of Polyimide Resin Film

A glass substrate with a size of 300 mm×400 mm×0.7 mm thickness (AN-100, manufactured by Asahi Glass Co., Ltd.) was spin-coated with the varnish prepared in Example 1 in such a manner that the film thickness would be 15±0.5 µm after 10-minute prebaking at 140° C. Then, prebaking treatment was carried out at 140° C. for 10 minutes using an air blow drier. The prebaked film was heated in a nitrogen flow (oxygen concentration 20 ppm or less) up to 300° C. at a rate of 3.5° C./min using an inert gas oven, maintained there for 30 minutes, and cooled down to 50° C. at a rate of 5° C./min to produce a polyimide resin film 2 (on a glass substrate).

[2] Production of TFT Substrate

A gas barrier layer 9 made of SiO was produced by plasma CVD on top of the polyimide resin film (on a glass substrate) prepared by the method described above. Subsequently, bottom gate type TFTs 10 were formed and an insulation film made of $Si_3N_4$ (not shown in the figure) was formed in such a manner as to cover these TFTs 10. Then, contact holes were formed in this insulation film and wiring (height 1.0 µm, not shown in the figure) connecting to the TFTs through these contact holes was formed on the insulation film. This wiring was designed for connection among the TFTs and between the TFTs and an organic EL emission element that will be formed in a subsequent step.

In addition, in order to planarize the surface roughened by the wiring formation, a planarizing layer 11 was formed on the insulation film in such manner that the irregularities resulting from the wiring formation were embedded. The formation of the planarizing layer was carried out by spin-coating the substrate with a photosensitive polyimide varnish, prebaking it on a hot plate (at 120° C. for 3 minutes), exposed to light through an appropriately patterned mask, developed, and heat-treated in an air flow at 230° C. for 60 minutes. Coatability was high in the varnish coating step and the planarizing layer resulting from subsequent exposure, development, and heat treatment was free of creasing or cracking. It was found furthermore that the average wiring height was 500 nm and that the resulting planarizing layer contained 5 µm×5 µm square contact holes and had a thickness of about 2 µm.

[3] Production of Color Filter Layer

The planarizing layer 11 was coated with the nonphotosensitive red coloring agent composition PR-1 prepared in Preparation example 7 while adjusting the spinner's rotating speed in such a manner that the thickness would be 1.9 µm after heat treatment, followed by heating on a hot plate at 120° C. for 10 minutes to produce a red colored pixel. A positive photoresist (LC-100A, manufactured by Rohm and Haas Electronic Materials K.K.) was spread with a slit coater in such a manner that the thickness would be 1.0 μm after prebaking, followed by prebaking on a hot plate at 100° C. for 5 minutes. Using an ultraviolet ray exposure apparatus (PLA-501F, manufactured by Canon Inc., light was applied at 100 mJ/cm$^2$ (ultraviolet ray intensity at 365 nm) through a photomask. Then, the development of the photoresist and the etching of the resin coat film were carried out simultaneously with a 2.0% aqueous solution of tetramethylammonium hydroxide to form a pattern. In the next step, the resist was removed with methyl cellosolve acetate. Then, curing was carried out by heat treatment in an oven at 270° C. for 30 minutes to prepare a red pixel 5R with a thickness of 1.9 μm.

The same procedure was repeated to produce a green pixel 5G made of the nonphotosensitive green coloring agent composition PG-1 prepared in Preparation example 8 and a blue pixel 5B made of the nonphotosensitive green coloring agent composition PB-1 prepared in Preparation example 9.

[3] Production of Overcoat Layer

A substrate provided with a color filter layer was spin-coated with the photosensitive positive transparent resist prepared in Preparation example 12 using a spin coater (1H-360S, manufactured by Mikasa Co., Ltd.) at an appropriate rotating speed, followed by prebaking on a hot plate (SCW-636, manufactured by Dainippon Screen Mfg. Co., Ltd.) at 90° C. for 2 minutes to produce a film with a thickness of 3 μm. The resulting film was subjected to pattern exposure through a gray scale mask designed for sensitivity measurement using an ultra-high pressure mercury lamp in combination with a parallel light mask aligner (hereinafter, abbreviated as PLA) (PLA-501F, manufactured by Canon Inc.) and then it was subjected to shower development for 60 seconds with a 2.38 wt % aqueous solution of tetramethyl ammonium hydroxide (ELM-D (trade name), manufactured by Mitsubishi Gas Chemical Co., Inc.) using an automatic development apparatus (AD-2000, manufactured by Takizawa Sangyo Co., Ltd.), followed by rinsing for 30 seconds. Then, bleaching exposure was performed to apply a light over the entire surface using an ultra-high pressure mercury lamp at 3000 J/m$^2$ (in terms of exposure to light with a wavelength of 365 nm) in combination with a PLA (PLA-501F, manufactured by Canon Inc.).

Subsequently, soft baking was performed on a hot plate at 110° C. for 2 minutes and then curing was performed in air at 230° C. for 1 hour using an oven (IHPS-222, manufactured by Tabai Espec Corp.) to produce an overcoat layer (not shown in the figure).

[4] Production of Bottom Emission Type Organic EL Emission Element

The members described below were formed on the resulting overcoat layer to produce a bottom emission type organic EL emission element. First, the first electrode 12 made of ITO, which was connected to the wiring (not shown in the figure) through the contact holes, was formed on the overcoat layer. Then, the surface was coated with a resist, prebaked, exposed to light through an appropriately patterned mask, and developed. Using this resist pattern as mask, the first electrode 12 was patterned by wet etching with an ITO etchant. Subsequently, the resist pattern was removed using a resist stripping liquid (a liquid mixture of monoethanol amine and diethylene glycol monobutyl ether). After the removal operation, the substrate was rinsed and heated at 200° C. for 30 minutes for dehydration to provide an electrode substrate provided with a color filter layer. The change in the thickness of the color filter layer, measured before the stripping liquid treatment and after thermal dehydration, was less than 1%. The first electrode thus obtained corresponds to the anode of an organic EL emission element.

Next, the insulation layer 13 was formed in a shape that covers the edge of the first electrode 12. The insulation layer 13 was formed of the same photosensitive polyimide varnish as above. The provision of this insulation layer 13 serves to prevent short-circuiting between the first electrode and the second electrode 15 that will be formed in a subsequently step.

In addition, a white organic EL layer 14W was formed by depositing a hole transport layer, organic luminescent layer, and electron transport layer in this order through an appropriate pattern mask in a vacuum deposition apparatus. Subsequently, the second electrode 15 made of Al and Mg (Al: reflecting electrode) was formed over the entire surface above the substrate. In addition, a SiON sealing film 16 was formed by the CVD film production technique. The resulting substrate was taken out of the deposition apparatus and an excimer laser (wavelength 308 nm) was applied through the glass substrate to remove the organic EL emission element from the glass substrate. The resulting active matrix type organic EL emission element showed good luminescent performance when a voltage was applied through a drive circuit. It was also found that the performance of the resulting organic EL emission element was as good as that of organic EL emission elements produced on glass substrates.

Example 22

Figure 9:
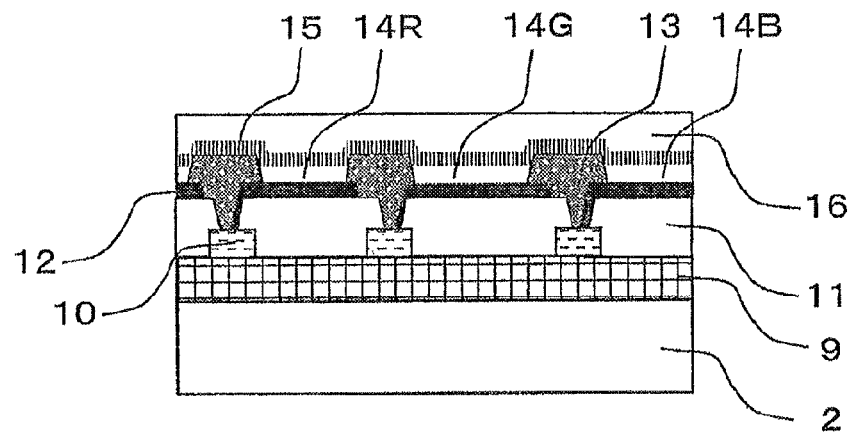
FIG. 9 A cross-sectional view showing a typical organic EL display.

Production of Organic EL Display (Active Matrix Type) (FIG. 9)

[1] Production of Polyimide Resin Film

A glass substrate with a size of 300 mm×400 mm×0.7 mm thickness (AN-100, manufactured by Asahi Glass Co., Ltd.) was spin-coated with the varnish prepared in Example 1 in such a manner that the film thickness would be 15±0.5 μm after 10-minute prebaking at 140° C. Then, prebaking treatment was carried out at 140° C. for 10 minutes using an air blow drier. The prebaked film was heated in a nitrogen flow (oxygen concentration 20 ppm or less) up to 300° C. at a rate of 3.5° C./min using an inert gas oven, maintained there for 30 minutes, and cooled down to 50° C. at a rate of 5° C./min to produce a polyimide resin film 2 (on a glass substrate).

[2] Production of TFT Substrate

A gas barrier layer 9 made of SiO was produced by plasma CVD on top of the polyimide resin film 2 (on a glass substrate) prepared by the method described above. Subsequently, bottom gate type TFTs 10 were formed and an insulation film made of $Si_3N_4$ (not shown in the figure) was formed in such a manner as to cover these TFTs. Then, contact holes were formed in this insulation film and wiring (height 1.0 μm, not shown in the figure) connecting to the TFTs through these contact holes was formed on the insulation film. This wiring was designed for connection among the TFTs and between the TFTs and an organic EL emission element that will be formed in a subsequent step.

In addition, in order to planarize the surface roughened by the wiring formation, a planarizing layer 11 was formed on the insulation film in such manner that the irregularities resulting from the wiring formation were embedded. The formation of the planarizing layer was carried out by spin-coating the substrate with a photosensitive polyimide varnish, prebaking it on a hot plate (at 120° C. for 3 minutes), exposed to light through an appropriately patterned mask, developed, and heat-treated in an air flow at 230° C. for 60 minutes. Coatability was high in the varnish coating step and the planarizing layer resulting from subsequent exposure, development, and heat treatment was free of creasing or cracking. It was found furthermore that the average wiring height was 500 nm and that the resulting planarizing layer contained 5 μm×5 μm square contact holes and had a thickness of about 2 μm.

[3] Preparation of Top Emission Type Organic EL Emission Element

The members described below were formed on the TFT planarizing layer 11 obtained by the method described above to produce a top emission type organic EL emission element. First, the first electrode 12 made of Al and ITO (Al: reflecting electrode), which was connected to the wiring through the contact holes, was formed on the planarizing layer 11. Then, the surface was coated with a resist, pre-baked, exposed to light through an appropriately patterned mask, and developed. Using this resist pattern as mask, the first electrode was patterned by wet etching with an ITO etchant. Subsequently, the resist pattern was removed using a resist stripping liquid (a liquid mixture of monoethanol amine and diethylene glycol monobutyl ether). After the removal operation, the substrate was rinsed and heated at 200° C. for 30 minutes for dehydration to provide an electrode substrate provided with a planarizing layer. The change in the thickness of the planarizing layer, measured before the stripping liquid treatment and after thermal dehydration, was less than 1%. The first electrode 12 thus obtained corresponds to the anode of an organic EL emission element.

Next, the insulation layer 13 was formed in a shape that covers the edge of the first electrode 12. The insulation layer was formed of the same photosensitive polyimide varnish as above. The provision of this insulation layer serves to prevent short-circuiting between the first electrode 12 and the second electrode 15 that will be formed in a subsequently step.

In addition, a red organic EL layer 14R, green organic EL layer 14G, and blue organic EL layer 14B were formed by depositing a hole transport layer, organic luminescent layer, and electron transport layer in this order through appropriate pattern masks in a vacuum deposition apparatus. Subsequently, a second electrode 15 made of Mg and ITO was formed over the entire surface above the substrate. In addition, a SiON sealing film 16 was formed by the CVD film production technique. The resulting substrate was taken out of the deposition apparatus and an excimer laser (wavelength 308 nm) was applied through the glass substrate to remove the organic EL emission element from the glass substrate. The resulting active matrix type organic EL emission element showed good luminescent performance when a voltage was applied through a drive circuit. It was also found that the performance of the resulting organic EL emission element was as good as that of organic EL emission elements produced on glass substrates.

(Example 23) Preparation of Organic EL Display (Active Matrix Type) (FIG. 3)

[1] Production of Color Filter Provided with Glass Substrate

A color filter was produced on a glass substrate by the method described in Example 18.

[2] Production of TFTs Provided with Glass Substrate

Except for using the polyimide precursor varnish produced in Preparation example 1, the same procedure as in Example 20 was carried out to produce a polyimide resin film 8, gas barrier layer 9, TFTs 10, and planarizing layer 11 in this order.

[3] Production of Top Emission Type Organic EL Emission Element

The members described below were formed on the TFT planarizing layer 11 obtained by the method described above to produce a top emission type organic EL emission element. First, the first electrode 12 made of Al and ITO (Al: reflecting electrode), which was connected to the wiring through the contact holes, was formed on the planarizing layer 11. Then, the surface was coated with a resist, pre-baked, exposed to light through an appropriately patterned mask, and developed. Using this resist pattern as mask, the first electrode 12 was patterned by wet etching with an ITO etchant. Subsequently, the resist pattern was removed using a resist stripping liquid (a liquid mixture of monoethanol amine and diethylene glycol monobutyl ether). After the removal operation, the substrate was rinsed and heated at 200° C. for 30 minutes for dehydration to provide an electrode substrate provided with a planarizing layer. The change in the thickness of the planarizing layer, measured before the stripping liquid treatment and after thermal dehydration, was less than 1%. The first electrode 12 thus obtained corresponds to the anode of an organic EL emission element.

Next, the insulation layer 13 was formed in a shape that covers the edge of the first electrode 12. The insulation layer was formed of the same photosensitive polyimide varnish as above. The provision of this insulation layer serves to prevent short-circuiting between the first electrode and the second electrode 15 that will be formed in the subsequently step.

In addition, a white organic EL layer 14W was formed by depositing a hole transport layer, organic luminescent layer, and electron transport layer in this order through an appropriate pattern mask in a vacuum deposition apparatus. Subsequently, a second electrode 15 made of Mg and ITO was formed over the entire surface above the substrate. In addition, a SiON sealing film 16 was formed by the CVD film production technique.

[4] Production of Organic EL Display

The color filter provided with a glass substrate obtained in section [1] above and the top emission type organic EL emission element provided with a glass substrate obtained in section [3] above were pasted together with a sticking layer 17 in between. Then, an excimer laser (wavelength 308 nm) was applied through the glass substrate to remove the color filter and the organic EL emission element from the glass substrate to provide an organic EL display. The resulting active matrix type organic EL display showed good luminescent performance when a voltage was applied through a drive circuit. It was also found that the performance of the resulting organic EL emission element was as good as that of organic EL emission elements produced on glass substrates.

EXPLANATION OF NUMERALS

1: support substrate (glass substrate)
2: polyimide resin film
3: gas barrier layer
3': gas barrier layer (lower layer)
3": gas barrier layer (upper layer)
4: black matrix
5R: red colored pixel
5G: green colored pixel 5B: blue colored pixel
6: overcoat layer
7: glass substrate
8: polyimide resin film
9: gas barrier layer
10: TFTs
11: planarizing layer
12: first electrode
13: insulation layer
14W: white organic EL layer
14R: red organic EL layer
14G: green organic EL layer
14B: blue organic EL layer
15: second electrode
16: sealing film
17: sticking layer
20: CF
30: organic EL emission element

TABLE 1

|  | Dianhydride | | Diamine | | Transmittance (%) @400 nm | CTE (ppm/° C.) | Birefringence @633 nm |
| --- | --- | --- | --- | --- | --- | --- | --- |
|  | monomers | molar ratio | monomers | molar ratio | | | |
| Example 1 | BPDA/6FDA | 80/20 | CHDA/FDA | 90/10 | 92.8 | 27.9 | 0.0392 |
| Example 2 | BPDA/BSAA | 87/13 | CHDA/FDA | 95/5 | 80.7 | 29.8 | 0.0397 |
| Example 3 | BPDA/ODPA | 80/20 | CHDA/FDA | 92/8 | 80.1 | 29.7 | 0.0399 |
| Example 4 | BPDA/PMDA-HS | 80/20 | CHDA/FDA | 94/6 | 81.9 | 29.6 | 0.0381 |
| Example 5 | BPDA/BPAF | 90/10 | CHDA/FDA | 95/5 | 84.5 | 29.2 | 0.0329 |
| Example 6 | BPDA/BPF-EPA | 90/10 | CHDA/FDA | 95/5 | 82.5 | 28.9 | 0.0394 |
| Example 7 | BPDA/BPF-PA | 90/10 | CHDA/FDA | 95/5 | 83.1 | 29.2 | 0.0382 |
| Example 8 | BPDA/BPAF | 75/25 | CHDA/FDA | 95/5 | 89.3 | 35.4 | 0.0213 |
| Example 9 | BPDA/6FDA | 80/20 | CHDA/MFDA | 90/10 | 91.1 | 28.4 | 0.0388 |
| Example 10 | BPDA/6FDA | 80/20 | CHDA/FHA | 92/8 | 89.2 | 29.4 | 0.0343 |
| Example 11 | BPDA/6FDA | 80/20 | CHDA/BPF-AN | 90/10 | 90.3 | 29.8 | 0.0341 |
| Example 12 | BPDA | 100 | CHDA/FDA | 90/10 | 75.2 | 23.1 | 0.0567 |
| Example 13 | BPDA | 100 | CHDA/MFDA | 90/10 | 72.7 | 23.7 | 0.0562 |
| Example 14 | BPDA | 100 | CHDA/FHA | 92/8 | 71.6 | 24.1 | 0.0544 |
| Example 15 | BPDA | 100 | CHDA/BPF-AN | 90/10 | 73.4 | 23.6 | 0.0549 |
| Comparative example 1 | BPDA | 100 | CHDA | 100 | 86.8 | 13.2 | 0.1332 |
| Comparative example 2 | 6FDA | 100 | TFMB | 100 | 95.1 | 53.3 | 0.0048 |
| Comparative example 3 | BPDA/ODPA | 70/30 | CHDA | 100 | 86.9 | 23.9 | 0.0711 |
| Comparative example 4 | BPDA/6FDA | 80/20 | CHDA/FDA | 60/30 | 50.2 | 40.3 | 0.0122 |
| Comparative example 5 | BPDA | 100 | FDA | 100 | cracks found over entire surface of prebaked film | | |

|  | Crack evaluation (number of specimens) | substrate warp (mm) | BM position accuracy (μm) | Angle dependence of color coordinates (x, y) in OLED panel | |
| --- | --- | --- | --- | --- | --- |
|  |  |  |  | 0° | 70° |
| Example 1 | 0 | 0.03 | ±1.27 | (0.48, 0.42) | (0.45 0.42) |
| Example 2 | 0 | 0.05 | ±1.52 | (0.49, 0.39) | (0.45, 0.42) |
| Example 3 | 0 | 0.05 | ±1.48 | (0.49, 0.39) | (0.45, 0.42) |
| Example 4 | 0 | 0.05 | ±1.49 | (0.49, 0.39) | (0.45, 0.43) |
| Example 5 | 2 | 0.05 | ±1.46 | (0.49, 0.39) | (0.45, 0.42) |
| Example 6 | 1 | 0.05 | ±1.48 | (0.49, 0.39) | (0.45, 0.43) |
| Example 7 | 1 | 0.05 | ±1.50 | (0.49, 0.40) | (0.45, 0.42) |
| Example 8 | 5 | 0.09 | ±1.97 | (0.49, 0.40) | (0.46, 0.42) |
| Example 9 | 0 | 0.04 | ±1.43 | (0.48, 0.42) | (0.45, 0.43) |
| Example 10 | 0 | 0.05 | ±1.49 | (0.48, 0.42) | (0.45, 0.43) |
| Example 11 | 0 | 0.05 | ±1.51 | (0.48, 0.38) | (0.46, 0.40) |
| Example 12 | 1 | 0.02 | ±0.86 | (0.52, 0.38) | (0.44, 0.43) |
| Example 13 | 1 | 0.02 | ±0.83 | (0.52, 0.38) | (0.44, 0.44) |
| Example 14 | 0 | 0.02 | ±0.91 | (0.52, 0.38) | (0.44, 0.44) |
| Example 15 | 0 | 0.02 | ±0.85 | (0.52, 0.38) | (0.44, 0.43) |
| Comparative example 1 | 0 | 0.01 | ±0.85 | (0.49, 0.41) | (0.41, 0.41) |
| Comparative example 2 | 0 | 0.5 | ±3.21 | (0.48, 0.42) | (0.47, 0.43) |
| Comparative example 3 | 0 | 0.02 | ±1.02 | (0.49, 0.41) | (0.43, 0.43) |
| Comparative example 4 | 5 | 0.3 | ±2.51 | (0.55, 0.38) | (0.46, 0.42) |
| Comparative example 5 | 100 | — | — | — | — |

The invention claimed is:

1. A polyimide precursor comprising at least
   an acid dianhydride residue as represented by Formula (1),
   a diamine residue as represented by Formula (2), and
   one or more diamine residues as represented by Formula (3),
   the acid dianhydride residue as represented by Formula (1) accounting for 50 mol % or more of the total quantity of acid dianhydride residues in the polyimide precursor,
   the diamine residue as represented by Formula (2) accounting for 50 mol % or more of the total quantity of diamine residues in the polyimide precursor, and
   the diamine residue as represented by Formula (3) accounting for 15 mol % or less of the total quantity of diamine residues in the polyimide precursor:

[Chemical compound 1]

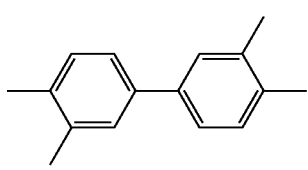

(1)

(2)

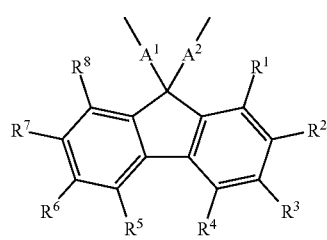

(3)

wherein $R^1$ to $R^8$ in Formula (3) are independently each selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, and silyl group, which may further contain a substituent group and which may contain a condensed ring structure formed of adjacent groups connected to each other; and wherein $A^1$ and $A^2$, which may be identical to or different from each other, each represent a structure formed of an aromatic ring, aliphatic ring, chain hydrocarbon group, a combination of a plurality thereof, or a combination thereof with one selected from the group consisting of amide group, ester group, ether group, alkylene group, oxyalkylene group, vinylene group, and haloalkylene group.

2. A polyimide precursor as claimed in claim 1 further comprising an acid dianhydride residue as represented by Formula (4):

[Chemical compound 2]

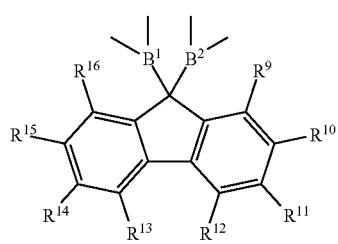

(4)

wherein $R^9$ to $R^{16}$ in Formula (4) are independently each selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, and silyl group, which may further contain a substituent group and which may contain a condensed ring structure formed of adjacent groups connected to each other; and $B^1$ and $B^2$, which may be identical to or different from each other, each represent a structure formed of an aromatic ring, aliphatic ring, chain hydrocarbon group, a combination of a plurality thereof, or a combination thereof with one selected from the group consisting of amide group, ester group, ether group, alkylene group, oxyalkylene group, vinylene group, and haloalkylene group.

3. A polyimide precursor as claimed in claim 2, wherein $B^1$ and $B^2$ in Formula (4) each represent one selected from the group of (11) to (17):

[Chemical compound 4]

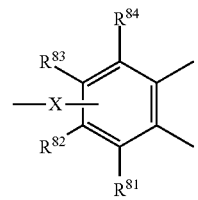

(11)

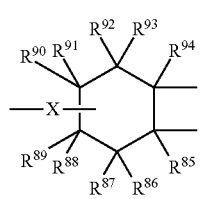

(12)

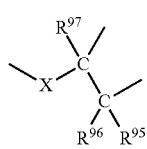

(13)

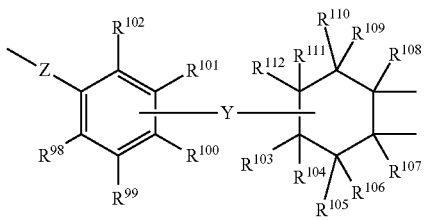

(14)

-continued

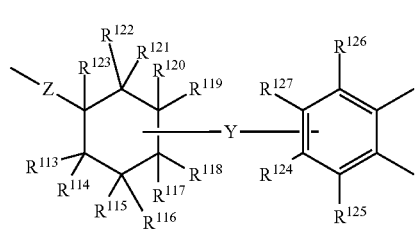

(15)

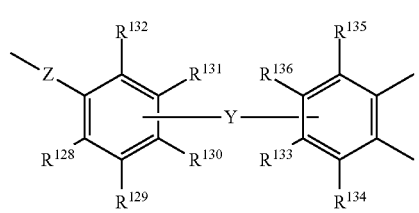

(16)

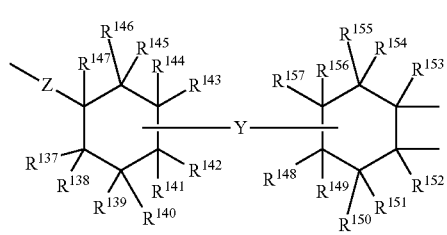

(17)

wherein X in Formulae (11) to (13) is a single bond, ether group, alkylene group, oxyalkylene group, or vinylene group, and the other bond is connected to a fluorene ring;

Y in Formulae (14) to (17) is an amide group, ester group, ether group, alkylene group, oxyalkylene group, vinylene group, or haloalkylene group;

Z in Formulae (14) to (17) is a single bond and the other bond is connected to the fluorene ring;

$R^{81}$ to $R^{157}$ in Formula (11) to (17) are independently selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, hydroxyl group, and silyl group; one of $R^{81}$ to $R^{84}$ in Formula (11) is a linking group containing X; one of $R^{85}$ to $R^{94}$ in Formula (12) is a linking group containing X; one of $R^{98}$ to $R^{102}$ and one of $R^{103}$ to $R^{112}$ in Formula (14) each are a linking group containing Y; one of $R^{113}$ to $R^{123}$ and one of $R^{124}$ to $R^{127}$ in Formula (15) each are a linking group containing Y; one of $R^{128}$ to $R^{132}$ and one of $R^{133}$ to $R^{136}$ in Formula (16) each are a linking group containing Y; and one of $R^{137}$ to $R^{147}$ and one of $R^{148}$ to $R^{157}$ in Formula (17) each are a linking group containing Y.

4. A polyimide precursor as claimed in claim 2, wherein the acid dianhydride residue as represented by Formula (4) is at least one tetravalent organic group selected from Formulae (22) to (24):

[Chemical compound 6]

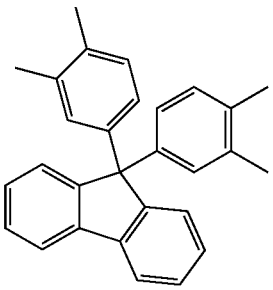

(22)

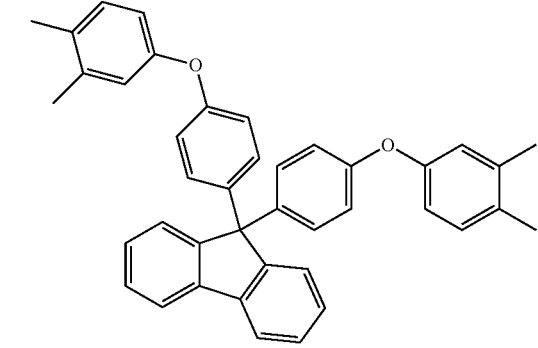

(23)

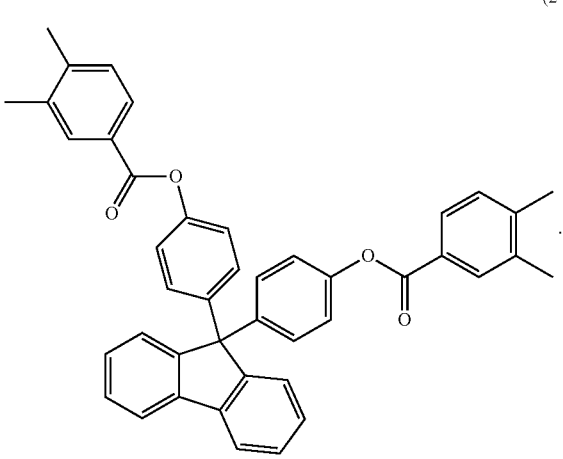

(24)

5. A polyimide precursor as claimed in claim 1, wherein $A^1$ and $A^2$ in Formula (3) each represent one selected from the group of (5) to (10) given below:

[Chemical compound 3]

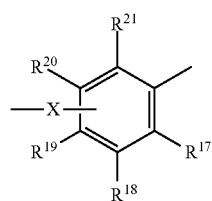

(5)

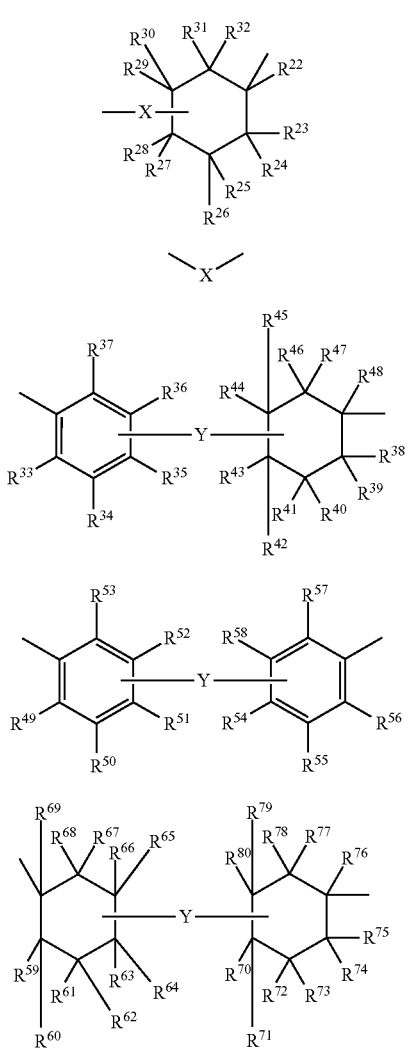

(6)

(7)

(8)

(9)

(10)

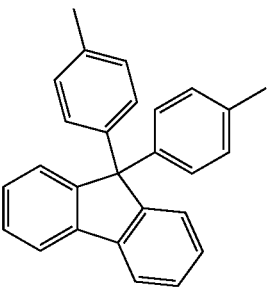

(18)

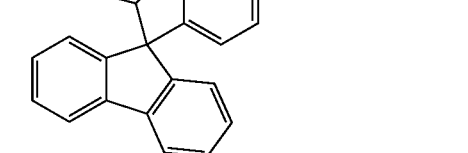

(19)

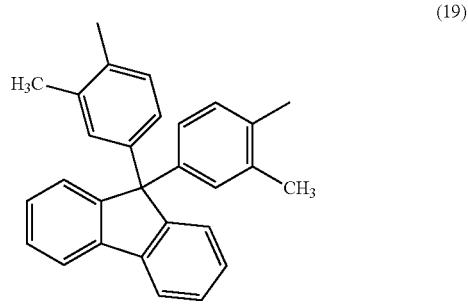

(20)

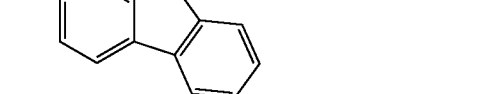

(21)

wherein X in Formulae (5) to (7) is a single bond, ether group, alkylene group, oxyalkylene group, or vinylene group, and the other bond is connected to a fluorene ring;

Y in Formulae (8) to (10) is an amide group, ester group, ether group, alkylene group, oxyalkylene group, vinylene group, or haloalkylene group;

$R^{17}$ to $R^{80}$ in Formulae (5) to (10) are independently selected from the group consisting of a hydrogen atom, alkyl group, cycloalkyl group, heterocyclic group, alkenyl group, cycloalkenyl group, alkoxy group, aryl ether group, aryl group, haloalkyl group, cyano group, hydroxyl group, and silyl group; one of $R^{17}$ to $R^{21}$ in Formula (5) is a linking group containing X; one of $R^{22}$ to $R^{32}$ in Formula (6) is a linking group containing X; either of the two ring structures in Formulae (8) to (10) may be connected to the fluorene ring; one of $R^{33}$ to $R^{37}$ and one of $R^{38}$ to $R^{48}$ each are a linking group containing Y; one of $R^{49}$ to $R^{53}$ and one of $R^{54}$ to $R^{58}$ each are a linking group containing Y; and one of $R^{59}$ to $R^{69}$ and one of $R^{70}$ to $R^{80}$ each are a linking group containing Y.

6. A polyimide precursor as claimed in claim 1, wherein the diamine residue as represented by Formula (3) is at least one divalent organic group selected from Formulae (18) to (21):

7. A polyimide precursor as claimed in claim 1 further comprising at least one acid dianhydride residue selected from the group consisting of Formulae (25) to (28):

[Chemical compound 7]

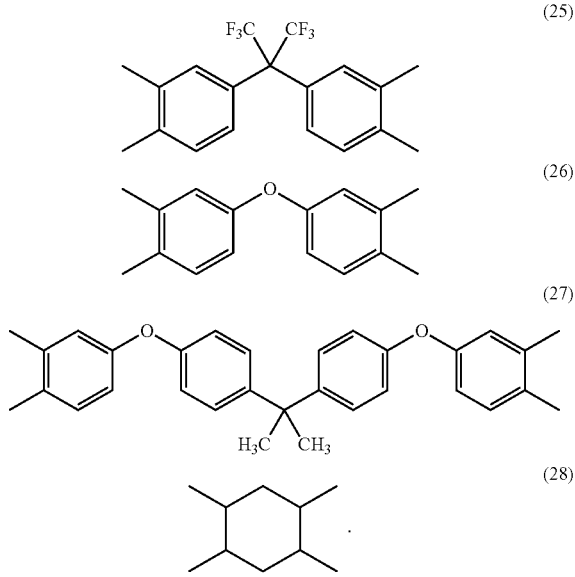

(25)
(26)
(27)
(28)

8. A polyimide precursor as claimed in claim 7, wherein the number of moles of the diamine residue as represented by Formula (3) is equal to or smaller than the total number of moles of the at least one acid dianhydride residue selected from the group consisting of Formulae (25) to (28).

9. A polyimide resin film obtainable from a polyimide precursor as claimed in claim 1.

10. A display element comprising polyimide resin film as claimed in claim 9.

11. A display element as claimed in claim 10, wherein the display element is an organic EL emission element.

12. An organic EL display equipped with an organic EL emission element as claimed in claim 11.

13. An optical element comprising polyimide resin film as claimed in claim 9.

14. An optical element as claimed in claim 13, wherein the optical element is a color filter.

15. An organic EL display equipped with a color filter as claimed in claim 14.

16. A light-receiving element comprising polyimide resin film as claimed in claim 9.

17. A touch screen comprising polyimide resin film as claimed in claim 9.

18. A circuit board comprising polyimide resin film as claimed in claim 9.

19. A production method for organic EL emission elements comprising:
(1) a step for coating a support substrate with a polyimide precursor resin composition that contains a polyimide precursor as claimed in claim 1 and a solvent,
(2) a step for removing the solvent from the coating of the polyimide precursor resin composition,
(3) a step for imidizing the polyimide precursor to form a polyimide resin film,
(4) a step for forming an organic EL circuit on the polyimide resin film, and
(5) a step for removing the polyimide resin film from the support substrate.

20. A production method for color filters comprising:
(1) a step for coating a support substrate with a polyimide precursor resin composition that contains a polyimide precursor as claimed in claim 1 and a solvent,
(2) a step for removing the solvent from the coating of the polyimide precursor resin composition,
(3) a step for imidizing the polyimide precursor to form a polyimide resin film,
(4) a step for forming a black matrix on the polyimide resin film,
(5) a step for forming a colored pixel on the polyimide resin film, and
(6) a step for removing the resin film from the support substrate.

* * * * *